(12) United States Patent
Choi et al.

(10) Patent No.: US 8,502,387 B2
(45) Date of Patent: Aug. 6, 2013

(54) INTEGRATED CIRCUIT PACKAGING SYSTEM WITH VERTICAL INTERCONNECTION AND METHOD OF MANUFACTURE THEREOF

(75) Inventors: DaeSik Choi, Seoul (KR); Taewoo Lee, Yongin-si (KR); KyuWon Lee, Ansung-Si (KR); SungWon Cho, Icheon-si (KR)

(73) Assignee: Stats Chippac Ltd., Singapore (SG)

( * ) Notice: Subject to any disclaimer, the term of this patent is extended or adjusted under 35 U.S.C. 154(b) by 62 days.

(21) Appl. No.: 12/964,617

(22) Filed: Dec. 9, 2010

(65) Prior Publication Data
US 2012/0146235 A1    Jun. 14, 2012

(51) Int. Cl.
*H01L 29/40* (2006.01)

(52) U.S. Cl.
USPC .......................... 257/774; 438/124

(58) Field of Classification Search
USPC ................ 257/273–274; 438/121–124
See application file for complete search history.

(56) References Cited

U.S. PATENT DOCUMENTS

| | | | |
|---|---|---|---|
| 5,844,315 A | 12/1998 | Melton et al. | |
| 6,020,629 A * | 2/2000 | Farnworth et al. | 257/686 |
| 6,191,494 B1 | 2/2001 | Ooyama et al. | |
| 6,388,333 B1 | 5/2002 | Taniguchi et al. | |
| 6,700,198 B2 | 3/2004 | Toya et al. | |
| 6,798,057 B2 | 9/2004 | Bolkin et al. | |
| 7,185,426 B1 | 3/2007 | Hiner et al. | |
| 7,271,031 B2 | 9/2007 | Lam et al. | |
| 7,345,361 B2 | 3/2008 | Mallik et al. | |
| 7,777,351 B1 | 8/2010 | Berry et al. | |
| 2007/0273049 A1 * | 11/2007 | Khan et al. | 257/787 |
| 2007/0290376 A1 * | 12/2007 | Zhao et al. | 257/787 |
| 2008/0073769 A1 | 3/2008 | Wu et al. | |
| 2008/0230887 A1 | 9/2008 | Sun et al. | |
| 2010/0171205 A1 | 7/2010 | Chen et al. | |
| 2010/0237482 A1 | 9/2010 | Yang et al. | |

OTHER PUBLICATIONS

U.S. Appl. No. 12/639,997, filed Dec. 17, 2009, Yang et al.

\* cited by examiner

*Primary Examiner* — Julio J Maldonado
*Assistant Examiner* — Robert Bachner
(74) *Attorney, Agent, or Firm* — Ishimaru & Associates LLP

(57) ABSTRACT

A method of manufacture of an integrated circuit packaging system includes: forming an outer contact pad having an outer pad top side; mounting an integrated circuit above the outer pad top side; forming an encapsulation having an encapsulation top side and an encapsulation bottom side, the encapsulation over the integrated circuit with the encapsulation bottom side coplanar with the outer pad top side; and forming a vertical interconnect through the encapsulation, the vertical interconnect having an interconnect bottom side directly on the outer pad top side and an interconnect top side exposed from the encapsulation.

20 Claims, 11 Drawing Sheets

INTEGRATED CIRCUIT PACKAGING SYSTEM WITH VERTICAL INTERCONNECTION AND METHOD OF MANUFACTURE THEREOF

TECHNICAL FIELD

The present invention relates generally to an integrated circuit packaging system, and more particularly to a system for an integrated circuit packaging system with interconnection.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

Typically, the packages on which the integrated semiconductor chips are mounted include a substrate or other chip-mounting device. Substrates are parts that provide a package with mechanical base support and a form of electrical interface that would allow the external world to access the devices housed within the package.

A Package-on-Package (PoP) package is a 3-dimentional (3D) package in which fully tested packages, typically referred to as Known Good Packages (KGPs), are stacked on top of one another during the board mounting process. A conventional PoP package usually consists of a bottom package and a top package and has a two-tiered configuration. The bottom package is typically an ASIC or baseband chip and the top package may be other functional chip such as memory. Typically, both the bottom package and the top package have a laminated substrate or interposer.

The modern trend of semiconductor manufacturing and packaging technology requires multiple chips with different functionalities such as radio-frequency (RF), logic, analog, base-band, and memory be packaged into a single integrated circuit system. Conventional PoP package is facing increasing challenge to accommodate more and more functional chips in a single package with tight space constraint. The conventional two-tiered configuration can no longer fulfill this purpose effectively.

Thus, a need still remains for accommodating the modern trend of semiconductor manufacturing and packaging, reducing the package footprint, increasing functionality integration, and increasing the packaging density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming an outer contact pad having an outer pad top side; mounting an integrated circuit above the outer pad top side; forming an encapsulation having an encapsulation top side and an encapsulation bottom side, the encapsulation over the integrated circuit with the encapsulation bottom side coplanar with the outer pad top side; and forming a vertical interconnect through the encapsulation, the vertical interconnect having an interconnect bottom side directly on the outer pad top side and an interconnect top side exposed from the encapsulation.

The present invention provides an integrated circuit packaging system, including: an outer contact pad having an outer pad top side; an integrated circuit above the outer pad top side; an encapsulation having an encapsulation top side and an encapsulation bottom side, the encapsulation over the integrated circuit with the encapsulation bottom side coplanar with the outer pad top side; and a vertical interconnect through the encapsulation, the vertical interconnect having an interconnect bottom side directly on the outer pad top side and an interconnect top side exposed from the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
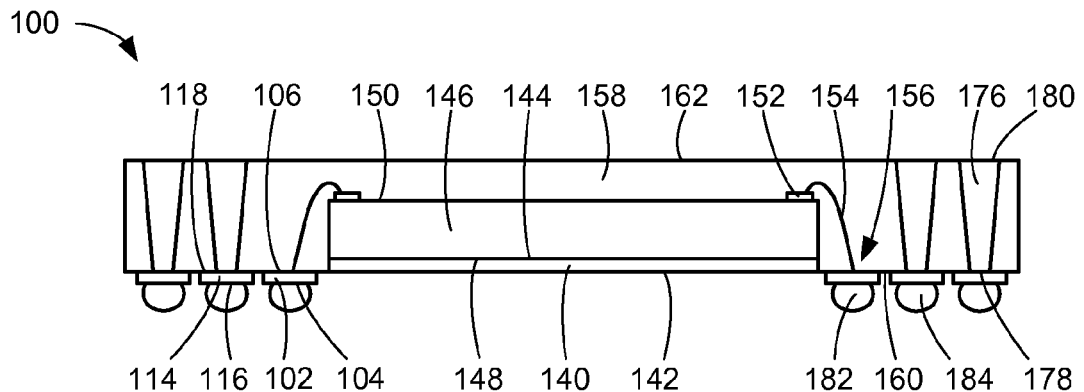
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
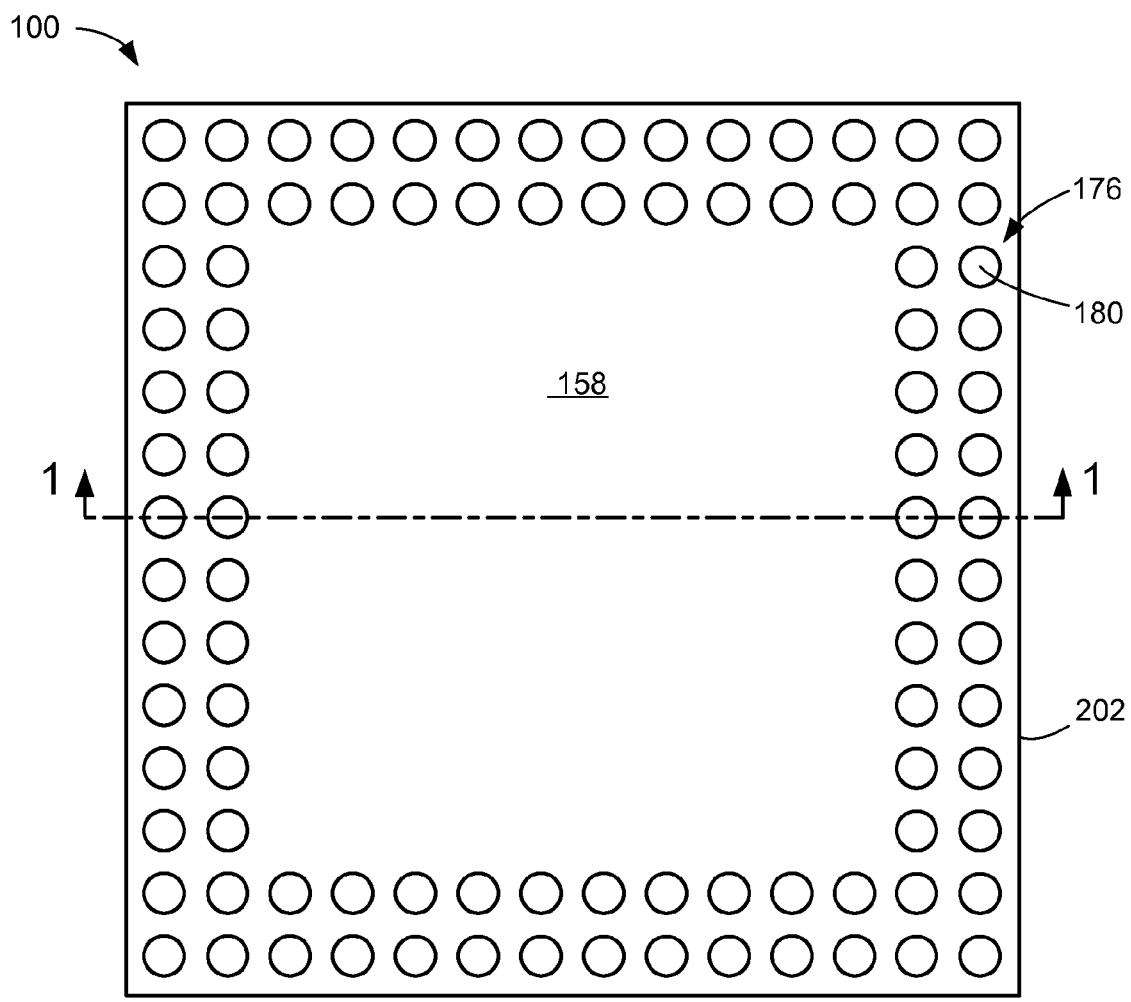
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include a molded laser package-on-package (MLP) package structure without a carrier or with a carrier removed.

The integrated circuit packaging system 100 can include an inner contact pad 102, which is a pad closest to a semiconductor device and formed with an electrically conductive material to which an electrical connector is attached. The inner contact pad 102 can include an inner pad bottom side 104 and an inner pad top side 106 at an opposite side to the inner pad bottom side 104.

The integrated circuit packaging system 100 can include an outer contact pad 114, which is a pad further from a semiconductor device than the inner contact pad 102 and formed with an electrically conductive material to which an electrical connector is attached. The outer contact pad 114 can include an outer pad bottom side 116 and an outer pad top side 118 at an opposite side to the outer pad bottom side 116. The outer contact pad 114 can be adjacent or next to the inner contact pad 102.

The outer pad bottom side 116 can be coplanar with the inner pad bottom side 104. The outer pad top side 118 can be coplanar with the inner pad top side 106.

The integrated circuit packaging system 100 can include an attach layer 140, which is a layer of a material that is used to support and mount a semiconductor device. For example, the attach layer 140 can include a die attach material.

The attach layer 140 can include an attach bottom side 142 and an attach top side 144 at an opposite side to the attach bottom side 142. The attach bottom side 142 can be coplanar with the inner pad top side 106, the outer pad top side 118, or a combination thereof. The inner pad bottom side 104 or the outer pad bottom side 116 can be below the attach bottom side 142.

The integrated circuit packaging system 100 can include an integrated circuit 146, which is a semiconductor device. For example, the integrated circuit 146 can include a chip, an integrated circuit die, a wirebond integrated circuit, or a flip chip.

The integrated circuit 146 can include an inactive side 148 and an active side 150 at an opposite side to the inactive side 148. The integrated circuit 146 can be attached to the attach layer 140 with the inactive side 148 over or directly on the attach top side 144.

The integrated circuit 146 or the attach layer 140 can be above the inner contact pad 102 and the outer contact pad 114. The inner contact pad 102 and the outer contact pad 114 can be adjacent horizontal extents of the integrated circuit 146 and the attach layer 140. The inner contact pad 102 and the outer contact pad 114 can be outside a perimeter of the integrated circuit 146 or the attach layer 140.

The integrated circuit 146 can include a terminal 152, which provides electrical connectivity from or to the integrated circuit 146. The terminal 152 can be formed at the active side 150.

The integrated circuit 146 and the attach layer 140 can be above the inner contact pad 102 and the outer contact pad 114. The integrated circuit 146 and the attach layer 140 can be surrounded by a number of the inner contact pad 102 and the outer contact pad 114.

The inner contact pad 102 can be between the outer contact pad 114 and the integrated circuit 146 or between the outer contact pad 114 and the attach layer 140. The inner contact pad 102 can be closer to the integrated circuit 146 and the attach layer 140 than the outer contact pad 114.

The integrated circuit packaging system 100 can include a device connector 154, which is an electrically conductive connector, attached to the integrated circuit 146 and the inner contact pad 102. The device connector 154 can be connected or attached to the terminal 152 and the inner contact pad 102. A connector lower end 156 of the device connector 154 can be connected or attached to the inner pad top side 106.

For illustrative purposes, the device connector 154 is shown as a bond wire, although it is understood that the device connector 154 can include any other electrically conductive connector. For example, the device connector 154 can be a conductive bump.

The integrated circuit packaging system 100 can include an encapsulation 158, which is a cover for a semiconductor package to seal a semiconductor device providing mechanical and environmental protection. The encapsulation 158 can be molded over the inner contact pad 102, the outer contact pad 114, the attach layer 140, the integrated circuit 146, and the device connector 154. The encapsulation 158 can be formed covering the inner pad top side 106, the outer pad top side 118, the attach layer 140, the integrated circuit 146, and the device connector 154.

The encapsulation 158 can include an encapsulation bottom side 160 and an encapsulation top side 162 at an opposite side to the encapsulation bottom side 160. At least two of the encapsulation bottom side 160, the inner pad top side 106, the outer pad top side 118, and the attach bottom side 142 can be coplanar with each other. The encapsulation bottom side 160 is partially exposed. The encapsulation bottom side 160 can be exposed between the inner contact pad 102 and the outer contact pad 114.

The inner contact pad 102 and the outer contact pad 114 can protrude from the encapsulation bottom side 160. For example, the inner contact pad 102 and the outer contact pad 114 can be lower than a molding line, such as the encapsulation bottom side 160.

The integrated circuit packaging system 100 can include a vertical interconnect 176, which is an electrically conductive connector. The vertical interconnect 176 can be formed through the encapsulation 158. The vertical interconnect 176 can be formed vertically between the encapsulation bottom side 160 and the encapsulation top side 162. For example, the vertical interconnect 176 can represent a connector of a molded laser package-on-package (MLP).

The vertical interconnect 176 can include an interconnect bottom side 178 and an interconnect top side 180 at an opposite side to the interconnect bottom side 178. The interconnect bottom side 178 and the interconnect top side 180 can be coplanar with the encapsulation bottom side 160 and the encapsulation top side 162, respectively. The interconnect bottom side 178 can be directly on the outer pad top side 118.

The vertical interconnect 176 can be partially exposed from the encapsulation 158. The interconnect top side 180 can be exposed from the encapsulation 158.

A width of the interconnect bottom side 178 can be less than a width of the interconnect top side 180, a width of the outer pad top side 118, or a combination thereof. Widths of the interconnect bottom side 178, the interconnect top side 180, and the outer pad top side 118 are horizontal distances between horizontal extents of the interconnect bottom side 178, the interconnect top side 180, and the outer pad top side 118, respectively.

For illustrative purposes, the vertical interconnect 176 is shown having a conical shape, although it is understood that the vertical interconnect 176 can include any other shape. For example, the vertical interconnect 176 can include a rectangular shape.

The integrated circuit packaging system 100 can include an inner external connector 182, which is an electrically conductive connector, connected or attached to the inner contact pad 102. The inner external connector 182 can be attached to the inner pad bottom side 104.

The integrated circuit packaging system 100 can include an outer external connector 184, which is an electrically conductive connector, connected or attached to the outer contact pad 114. The outer external connector 184 can be attached to the outer pad bottom side 116.

It has been discovered that the inner contact pad 102 and the outer contact pad 114 protruding from the encapsulation bottom side 160 provide more contact areas for connectivity to an external system.

It has also been discovered that the vertical interconnect 176 directly on the outer contact pad 114 provides vertical integration without a carrier thereby significantly reducing a package profile.

It has been unexpectedly found that the vertical interconnect 176 exposed from the encapsulation 158 at the encapsulation bottom side 160 and the encapsulation top side 162 provides z-interconnection improving integration for stacked packages.

It has been unexpectedly determined that the vertical interconnect 176 having a rigid structure through the encapsulation 158 reduces warpage for a top package of an exposed solder-on-pad package-on-package (eSOP-PoP) thereby improving reliability.

Referring now to FIG. 2, therein is shown a top view of the integrated circuit packaging system 100. The integrated circuit packaging system 100 can include a peripheral array or multiple rows of a number of the vertical interconnect 176 adjacent, along, or within an encapsulation perimeter 202 of the encapsulation 158. The interconnect top side 180 of the vertical interconnect 176 can be exposed from the encapsulation 158.

For illustrative purposes, the vertical interconnect 176 is shown having a shape of a circle, although it is understood that the vertical interconnect 176 can include any other shape. For example, the vertical interconnect 176 can include a shape of a square.

Figure 3:
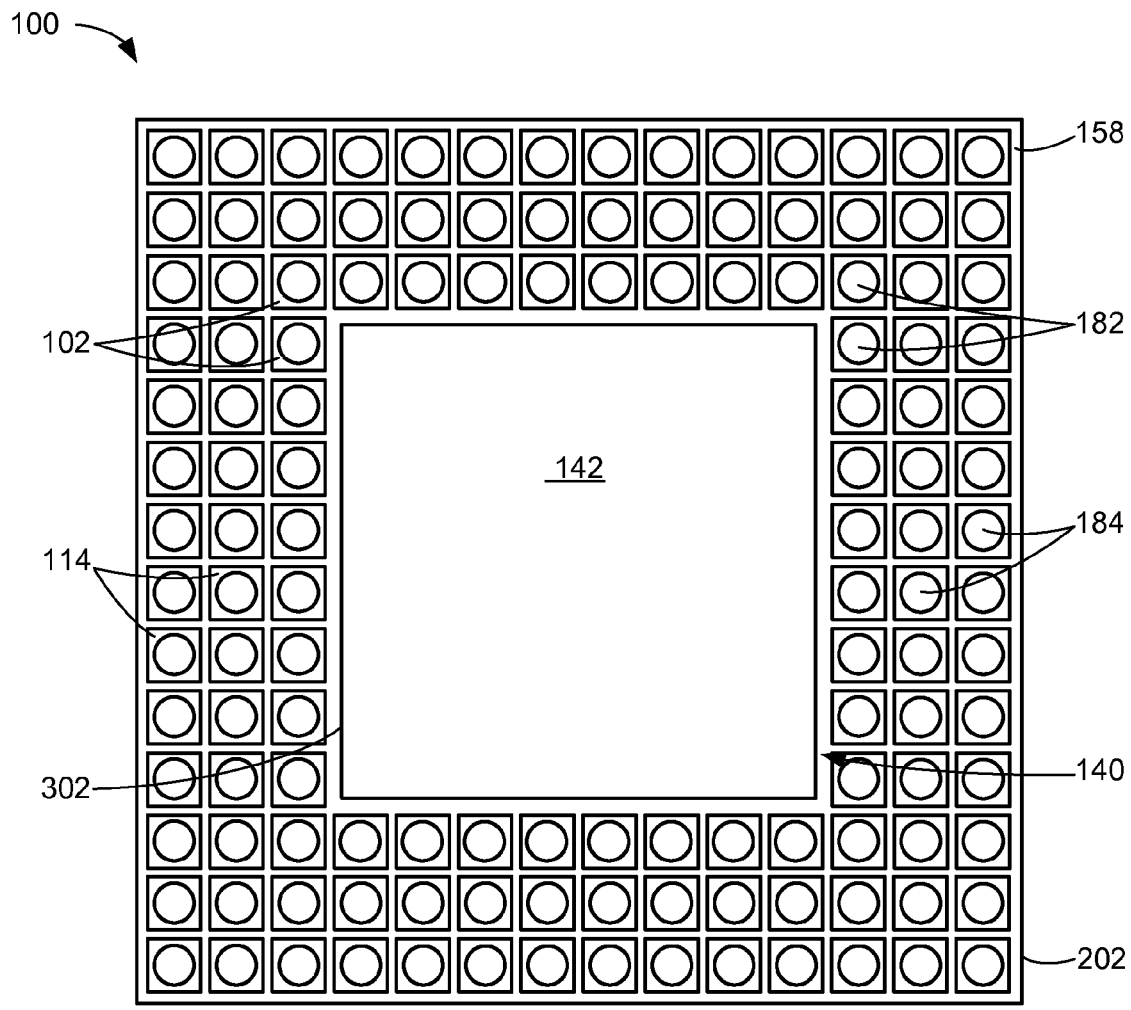
FIG. 3 is a bottom view of the integrated circuit packaging system.

Referring now to FIG. 3, therein is shown a bottom view of the integrated circuit packaging system 100. The integrated circuit packaging system 100 can include an array or a row of a number of the inner external connector 182 connected or attached to an inner pad array or a row of a number of the inner contact pad 102. An array or a row of the inner external connector 182 or of the inner contact pad 102 can be formed adjacent or surrounding an attach perimeter 302 of the attach layer 140 at the attach bottom side 142.

The integrated circuit packaging system 100 can include a peripheral array or a number of rows of the outer external connector 184 connected or attached to a peripheral pad array or a number of rows of the outer contact pad 114. A peripheral array or a number of rows of the outer external connector 184 or of the outer contact pad 114 can be formed adjacent or surrounding an array or a row of the inner external connector 182 or of the inner contact pad 102.

A number of the outer external connector 184 or of the outer contact pad 114 can be formed between the encapsulation perimeter 202 of the encapsulation 158 and a number of the inner external connector 182 or of the inner contact pad 102. A number of the inner external connector 182 or of the inner contact pad 102 can be formed between the attach layer 140 and a number of the outer external connector 184 or of the outer contact pad 114. The inner external connector 182 and the inner contact pad 102 can be formed closer to the attach layer 140 than the outer external connector 184 and the outer contact pad 114.

For illustrative purposes, the inner contact pad 102 or the outer contact pad 114 is shown having a shape of a square, although it is understood that the inner contact pad 102 or the outer contact pad 114 can include any other shape. For example, the inner contact pad 102 or the outer contact pad 114 can include a shape of a circle.

For illustrative purposes, the inner external connector 182 or the outer external connector 184 is shown having a shape of a circle, although it is understood that the inner external connector 182 or the outer external connector 184 can include any other shape. For example, the inner external connector 182 or the outer external connector 184 can include a shape of a square.

Figure 4:
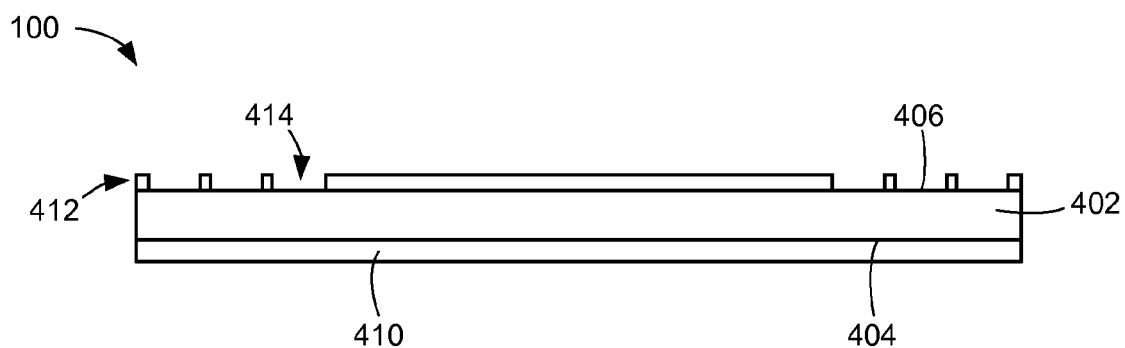
FIG. 4 is a cross-sectional view of the integrated circuit packaging system in a resist-forming phase of manufacture.

Referring now to FIG. 4, therein is shown a cross-sectional view of the integrated circuit packaging system 100 in a resist-forming phase of manufacture. The integrated circuit packaging system 100 can include a package carrier 402, which is a structure that provides mounting support for a semiconductor device.

The package carrier 402 can include a carrier bottom side 404 and a carrier top side 406 at an opposite side to the carrier bottom side 404. The package carrier 402 can be provided as a foil, a strip, a panel, or a sheet. The package carrier 402 can include a carrier material including a metallic material, a metallic alloy, dummy silicon, or any other suitable carrier material.

For example, the package carrier 402 can include a metallic material including copper, aluminum, or any other metal. Also for example, the package carrier 402 can include a support structure including a carrier or a substrate.

The integrated circuit packaging system 100 can include a bottom resist layer 410 and a top resist layer 412, which are layers formed with a material that is resistant to a removal process including a chemical or mechanical method. The bottom resist layer 410 and the top resist layer 412 can be formed directly on the carrier bottom side 404 and the carrier top side 406, respectively, to protect portions of the package carrier 402. For example, the bottom resist layer 410 and the top resist layer 412 can be resistant to a removal process including an etching treatment.

The top resist layer 412 can be formed with a number of processes. For example, the top resist layer 412 can be formed with a patterning process or a photoresist process to form a resist cavity 414 in the top resist layer 412. The resist cavity 414 is an opening through the top resist layer 412 exposing a portion of the package carrier 402 at the carrier top side 406.

Figure 5:
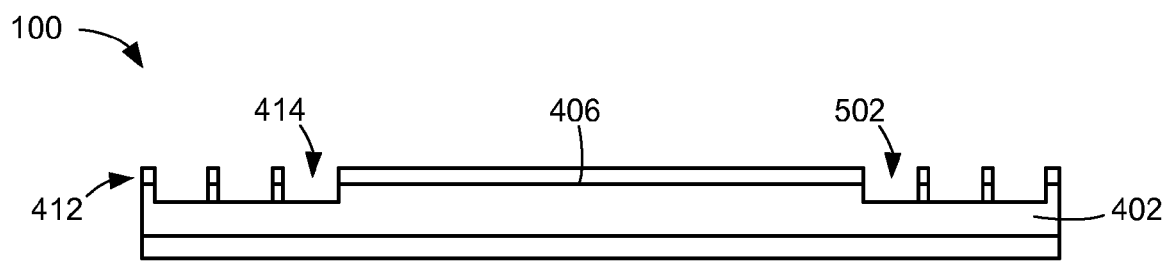
FIG. 5 is the structure of FIG. 4 in a partial carrier removal phase.

Referring now to FIG. 5, therein is shown the structure of FIG. 4 in a partial carrier removal phase. The integrated circuit packaging system 100 can include a removal process including etching in the partial carrier removal phase.

A portion of the package carrier 402 at the carrier top side 406 that is exposed from the top resist layer 412 and below the resist cavity 414 can be removed to form a carrier lower region 502 in the package carrier 402. The carrier lower region 502 can be at or below the carrier top side 406. A contact pad can be formed directly on the carrier lower region 502 in a subsequent phase for connectivity to an external system.

The carrier lower region 502 can include a predetermined height, which is a vertical distance of vertical extents of the carrier lower region 502. The predetermined height defines a height of an encapsulation protrusion. For example, an alternative embodiment can include the carrier lower region 502 having a small height to form an encapsulation protrusion.

After the partial carrier removal phase, an alternative embodiment can include additional phases before forming a pad in a subsequent phase. For example, the additional phases can be included to remove the top resist layer 412, apply an additional resist layer over the carrier top side 406, and pattern the additional resist layer to form a pad directly on the carrier top side 406. Also for example, the additional phases can be included to remove the top resist layer 412, apply an additional resist layer over the carrier top side 406, pattern the additional resist layer, remove an additional portion of the package carrier 402 at or near the carrier top side 406, and remove a portion of the additional resist layer to form a pad with multiple segments.

Figure 6:
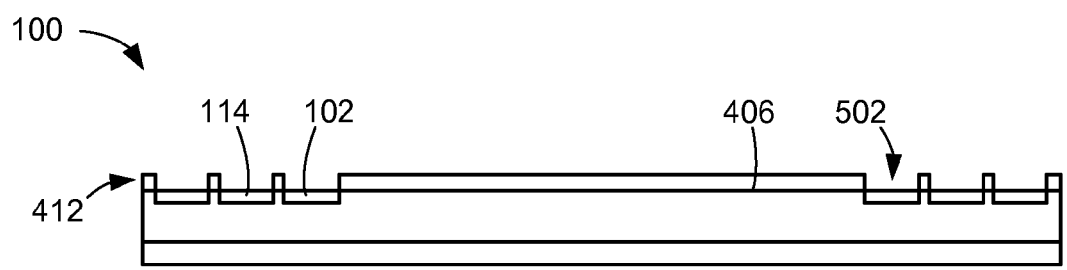
FIG. 6 is the structure of FIG. 5 in a pad-forming phase.

Referring now to FIG. 6, therein is shown the structure of FIG. 5 in a pad-forming phase. The integrated circuit packaging system 100 can include a pad forming process including plating. A pad array of a number of the inner contact pad 102 or a pad array of a number of the outer contact pad 114 can be formed on the mounting region, such as the carrier top side 406. The inner contact pad 102 and the outer contact pad 114 can be formed directly on the carrier lower region 502 for connectivity to an external system.

In an alternative embodiment, the inner contact pad 102 or the outer contact pad 114 can be formed with a recess. In another alternative embodiment, the inner contact pad 102 or the outer contact pad 114 can be formed with a top extent above the carrier top side 406.

After the pad-forming phase, an alternative embodiment can include additional phases before removing a resist layer in a subsequent phase. For example, the additional phases can be included to remove the top resist layer 412, apply an additional resist layer over the carrier top side 406, and pattern the additional resist layer to form a contact pad with a width of a lower end greater than a width of an upper end.

Figure 7:
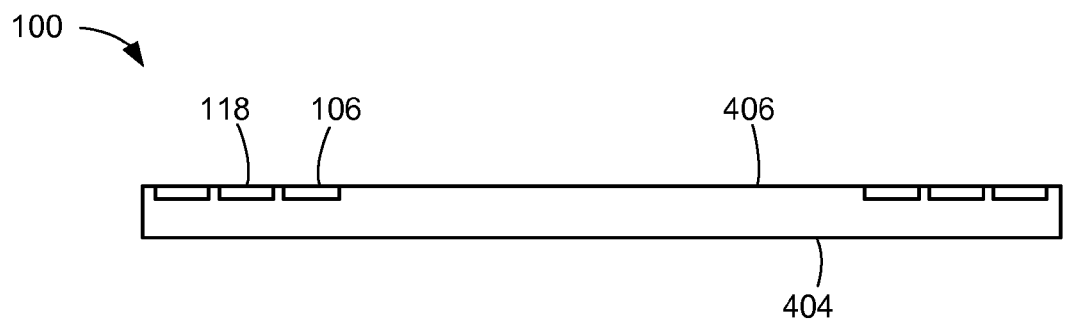
FIG. 7 is the structure of FIG. 6 in a resist removal phase.

Referring now to FIG. 7, therein is shown the structure of FIG. 6 in a resist removal phase. The bottom resist layer 410 of FIG. 4 and the top resist layer 412 of FIG. 4 can be removed exposing the carrier bottom side 404 and the carrier top side 406, respectively. The inner pad top side 106 or the outer pad top side 118 can be coplanar with the carrier top side 406.

Figure 8:
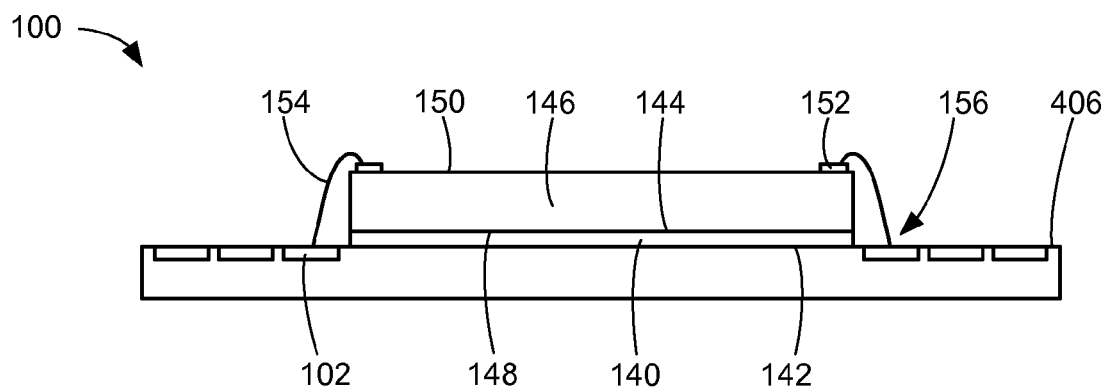
FIG. 8 is the structure of FIG. 7 in a device-attaching phase.

Referring now to FIG. 8, therein is shown the structure of FIG. 7 in a device-attaching phase. The integrated circuit packaging system 100 can include the attach layer 140 having the attach bottom side 142 attached over or directly on the carrier top side 406. The attach layer 140 can be attached over a portion of the carrier top side 406 that is adjacent or between the inner contact pad 102 and another of the inner contact pad 102.

The integrated circuit 146 can include the inactive side 148 facing and directly on the attach top side 144. The integrated circuit 146 can include the terminal 152 at the active side 150 connected or attached to the inner contact pad 102.

The integrated circuit packaging system 100 can include a connector attachment process including wire bonding to attach the device connector 154 to the terminal 152 and the inner contact pad 102. The connector lower end 156 of the device connector 154 can be connected or attached to the inner contact pad 102.

Figure 9:
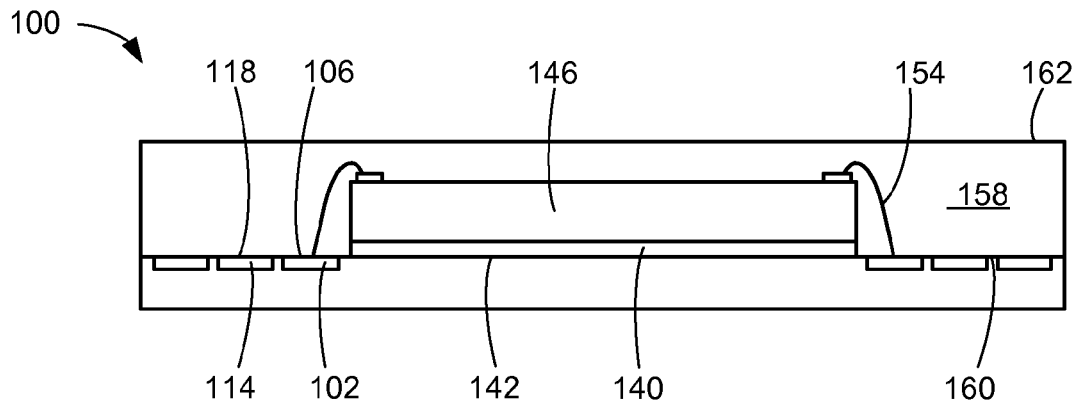
FIG. 9 is the structure of FIG. 8 in a molding phase.

Referring now to FIG. 9, therein is shown the structure of FIG. 8 in a molding phase. The integrated circuit packaging system 100 can include the encapsulation 158 molded over the inner contact pad 102, the outer contact pad 114, the attach layer 140, the integrated circuit 146, and the device connector 154. The encapsulation 158 can be formed covering the inner pad top side 106, the outer pad top side 118, the attach layer 140, the integrated circuit 146, and the device connector 154.

The encapsulation 158 can include the encapsulation bottom side 160 and the encapsulation top side 162. At least two of the encapsulation bottom side 160, the inner pad top side 106, the outer pad top side 118, and the attach bottom side 142 can be coplanar with each other.

Figure 10:
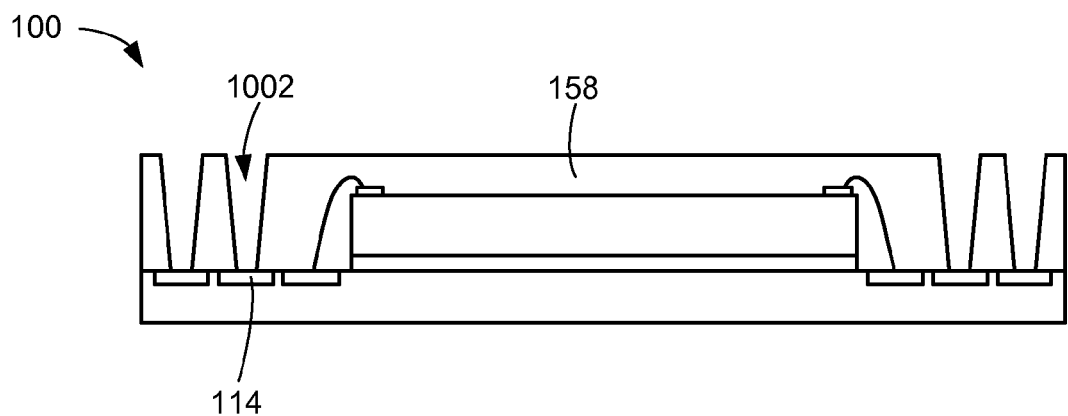
FIG. 10 is the structure of FIG. 9 in a partial molding removal phase.

Referring now to FIG. 10, therein is shown the structure of FIG. 9 in a partial molding removal phase. The integrated circuit packaging system 100 can include a hole formation process including laser, drilling, etching, or a mold chase with a protrusion. An encapsulation hole 1002 of the encapsulation 158 can be formed through the encapsulation 158.

A number of the encapsulation hole 1002 can be formed above the outer contact pad 114. For example, the encapsulation hole 1002 can be formed to provide z-interconnection in a subsequent phase for a molded laser package-on-package (MLP).

Figure 11:
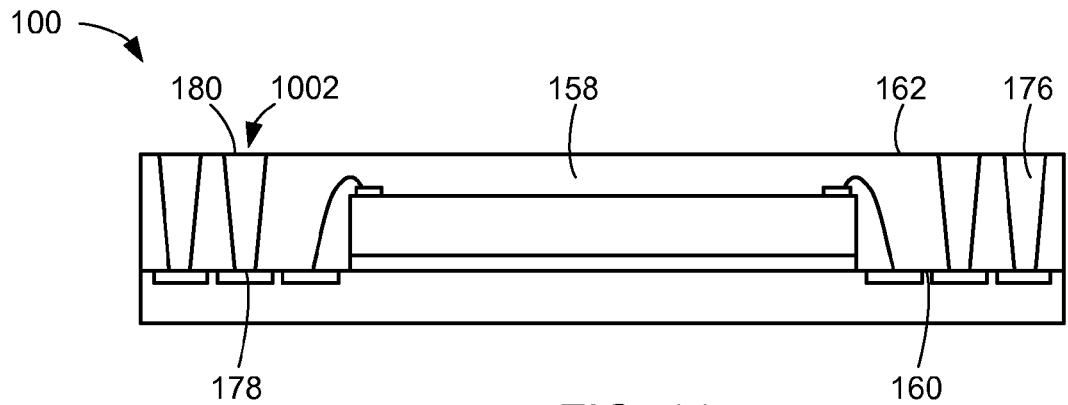
FIG. 11 is the structure of FIG. 10 in a filling phase.

Referring now to FIG. 11, therein is shown the structure of FIG. 10 in a filling phase. The integrated circuit packaging system 100 can include a conductor filling process including plating or screen-printing. The encapsulation hole 1002 can be filled with an electrically conductive material including a metallic material or a metal alloy to form the vertical interconnect 176. For example, the vertical interconnect 176 can be formed to provide z-interconnection.

The vertical interconnect 176 can be formed between the encapsulation bottom side 160 and the encapsulation top side 162. The interconnect bottom side 178 and the interconnect top side 180 can be coplanar with the encapsulation bottom side 160 and the encapsulation top side 162, respectively. The interconnect top side 180 can be exposed from the encapsulation 158.

Figure 12:
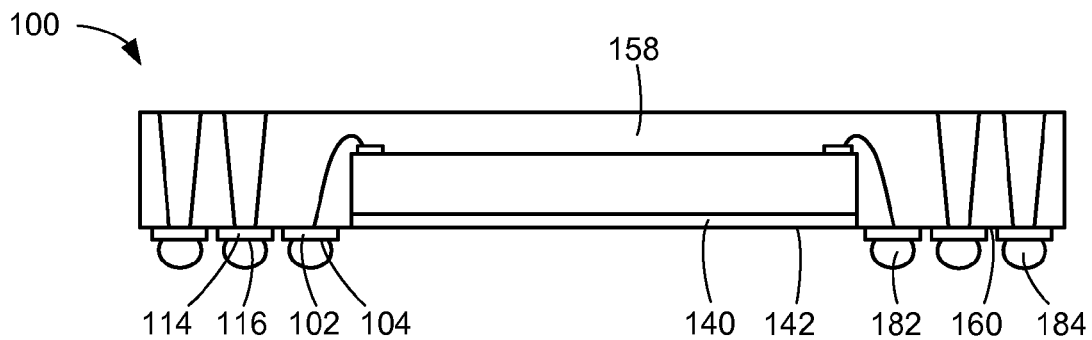
FIG. 12 is the structure of FIG. 11 in a connector-attaching phase.

Referring now to FIG. 12, therein is shown the structure of FIG. 11 in a connector-attaching phase. The package carrier 402 of FIG. 4 can be removed exposing the inner pad bottom side 104, horizontal extents of the inner contact pad 102, the outer pad bottom side 116, horizontal extents of the outer contact pad 114, the attach bottom side 142, and the encapsulation bottom side 160.

The integrated circuit packaging system 100 can include a connector attachment method including bump attach. The inner external connector 182 and the outer external connector 184 can be connected or attached to the inner pad bottom side 104 and the outer pad bottom side 116, respectively. The inner contact pad 102 and the outer contact pad 114 can be formed protruding from or below a molding line, such as the encapsulation bottom side 160, for connectivity to an external system.

The inner contact pad 102, the outer contact pad 114, the attach layer 140, and the encapsulation 158 can include characteristics of the package carrier 402 removed. The characteristics of the package carrier 402 removed can include the inner pad bottom side 104, horizontal extents of the inner contact pad 102, the outer pad bottom side 116, horizontal extents of the outer contact pad 114, the attach bottom side 142, and the encapsulation bottom side 160 having etched marks, grinding marks, sanding marks, other removal marks, or chemical residue.

Figure 13:
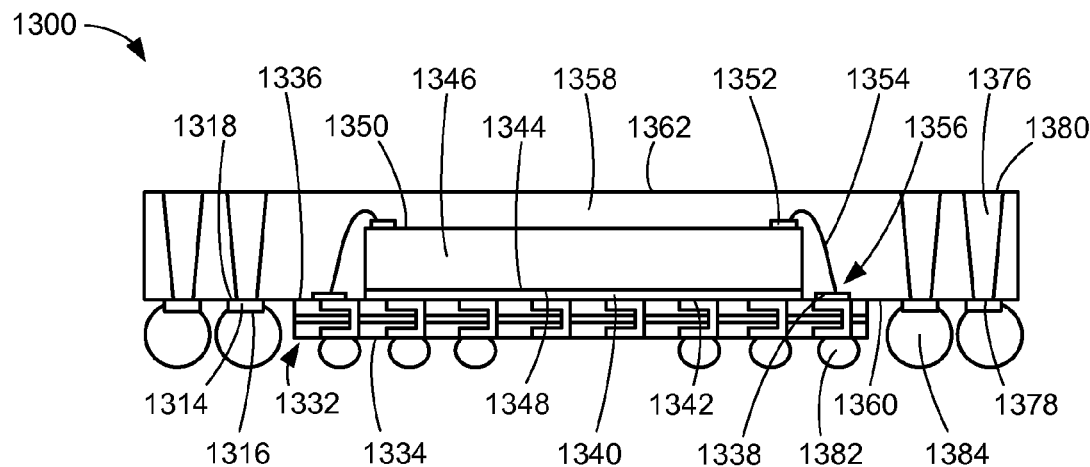
FIG. 13 is a cross-sectional view of an integrated circuit packaging system in a second embodiment of the present invention.

Referring now to FIG. 13, therein is shown a cross-sectional view of an integrated circuit packaging system 1300 in a second embodiment of the present invention. The integrated circuit packaging system 1300 can be similar to the integrated circuit packaging system 100 of FIG. 1, except for an addition of a substrate, the formation of the attach layer 140 of FIG. 1, the device connector 154 of FIG. 1, the encapsulation 158 of FIG. 1, and the inner external connector 182 of FIG. 1, and without the inner contact pad 102 of FIG. 1.

The integrated circuit packaging system 1300 can include an outer contact pad 1314 having an outer pad bottom side 1316 and an outer pad top side 1318. The outer contact pad 1314 can be formed in a manner similar to the outer contact pad 114 of FIG. 1.

The integrated circuit packaging system 1300 can include a package substrate 1332, which is a structure that provides mounting and connection support for a semiconductor device. The package substrate 1332 can include a substrate bottom side 1334 and a substrate top side 1336 at an opposite side to the substrate bottom side 1334. The package substrate 1332 can include a substrate pad 1338, which is a pad formed with an electrically conductive material to which an electrical connector is attached, at the substrate top side 1336.

The package substrate 1332 can include a number of pads, vertical insertion areas (vias), conductive layers, or a combination thereof to provide electrical connectivity between the substrate bottom side 1334 and the substrate top side 1336. The package substrate 1332 can include the substrate top side 1336 having a plane coplanar with the outer pad top side 1318.

The integrated circuit packaging system 1300 can include an attach layer 1340, which is a layer of a material that is used to support and mount a semiconductor device. The attach layer 1340 can be attached to a portion of the package substrate 1332 between the substrate pad 1338 and another of the substrate pad 1338. For example, the attach layer 1340 can include a die attach material.

The attach layer 1340 can include an attach bottom side 1342 and an attach top side 1344 at an opposite side to the attach bottom side 1342. The attach bottom side 1342 can be coplanar with the outer pad top side 1318. The attach bottom side 1342 can be attached to the substrate top side 1336. The outer pad bottom side 1316 can be below the attach bottom side 1342.

The integrated circuit packaging system 1300 can include an integrated circuit 1346 having an inactive side 1348, an active side 1350, and a terminal 1352. The integrated circuit 1346 can be formed in a manner similar to the integrated circuit 146 of FIG. 1, respectively.

The integrated circuit packaging system 1300 can include a device connector 1354, which is an electrically conductive connector, attached to the integrated circuit 1346 and the package substrate 1332. The device connector 1354 can be connected or attached to the terminal 1352 and the substrate pad 1338. A connector lower end 1356 of the device connector 1354 can be connected or attached to the substrate pad 1338.

The integrated circuit packaging system 1300 can include an encapsulation 1358, which is a cover for a semiconductor package to seal a semiconductor device providing mechanical and environmental protection. The encapsulation 1358 can be molded over the outer contact pad 1314, the package substrate 1332, the attach layer 1340, the integrated circuit 1346, and the device connector 1354. The encapsulation 1358 can be formed covering the outer pad top side 1318, the substrate top side 1336, the substrate pad 1338, the attach layer 1340, the integrated circuit 1346, and the device connector 1354.

The encapsulation 1358 can include an encapsulation bottom side 1360 and an encapsulation top side 1362 at an opposite side to the encapsulation bottom side 1360. At least two of the encapsulation bottom side 1360, the outer pad top side 1318, the substrate top side 1336, and the attach bottom side 1342 can be coplanar with each other.

The integrated circuit packaging system 1300 can include a vertical interconnect 1376 having an interconnect bottom side 1378 and an interconnect top side 1380. The vertical interconnect 1376 can be formed in a manner similar to the vertical interconnect 176 of FIG. 1.

The integrated circuit packaging system 1300 can include an inner external connector 1382, which is an electrically conductive connector, connected or attached to the substrate bottom side 1334. A number of the inner external connector 1382 can be attached to the package substrate 1332. The inner external connector 1382 can be attached near a periphery of the package substrate 1332 at the substrate bottom side 1334.

The integrated circuit packaging system 1300 can include an outer external connector 1384. The outer external connector 1384 can be formed in a manner similar to the outer external connector 184 of FIG. 1. A number of the outer external connector 1384 attached to the outer contact pad 1314 can be formed surrounding the package substrate 1332 and a number of the inner external connector 1382.

A bottom extent of the inner external connector 1382 can be coplanar with a bottom extent of the outer external connector 1384. A distance between a bottom extent of the inner external connector 1382 and the substrate top side 1336 can be approximately equal to a distance between a bottom extent of the outer external connector 1384 and the outer pad top side 1318.

A height of the inner external connector 1382 can be less than half of a height of the outer external connector 1384. Heights of the inner external connector 1382 and the outer external connector 1384 are vertical distances between bottom and top extents of the inner external connector 1382 and the outer external connector 1384, respectively.

It has been discovered that the package substrate 1332 attached to the device connector 1354 provides increased electrical connectivity for the integrated circuit 1346 to be connected to an external system due to area bonding as opposed to perimeter bonding.

Figure 14:
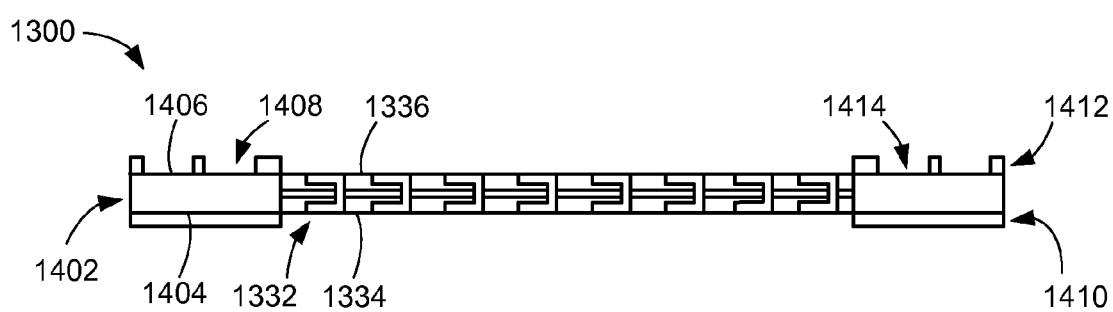
FIG. 14 is a cross-sectional view of the integrated circuit packaging system in a resist-forming phase of manufacture.

Referring now to FIG. 14, therein is shown a cross-sectional view of the integrated circuit packaging system 1300 in a resist-forming phase of manufacture. The integrated circuit packaging system 1300 can include a package carrier 1402, which is a structure that provides mounting support for a semiconductor device. The package carrier 1402 can include a carrier bottom side 1404 and a carrier top side 1406 at an opposite side to the carrier bottom side 1404.

The package carrier 1402 can be provided as a foil, a strip, a panel, or a sheet. The package carrier 1402 can include a carrier material including a metallic material, a metallic alloy, dummy silicon, or any other suitable carrier material. For example, the package carrier 1402 can include a metallic material including copper, aluminum, or any other metal.

The package carrier 1402 can include a carrier cavity 1408 in the package carrier 1402. The carrier cavity 1408 is an opening through the package carrier 1402 and between the carrier bottom side 1404 and the carrier top side 1406.

The integrated circuit packaging system 1300 can include the package substrate 1332 within the carrier cavity 1408. The substrate bottom side 1334 and the substrate top side 1336 can be coplanar with the carrier bottom side 1404 and the carrier top side 1406, respectively.

The integrated circuit packaging system 1300 can include a bottom resist layer 1410 and a top resist layer 1412, which are formed with a material that is resistant to a removal process including a chemical or mechanical method. The bottom resist layer 1410 and the top resist layer 1412 can be formed directly on the carrier bottom side 1404 and the carrier top side 1406, respectively, to protect portions of the package carrier 1402. For example, the bottom resist layer 1410 and the top resist layer 1412 can be resistant to a removal process including an etching treatment.

The top resist layer 1412 can be formed with a number of processes. For example, the top resist layer 1412 can be formed with a patterning process or a photo-resist process to form a resist cavity 1414 in the top resist layer 1412. The resist cavity 1414 can expose a portion of the package carrier 1402 at the carrier top side 1406.

Figure 15:
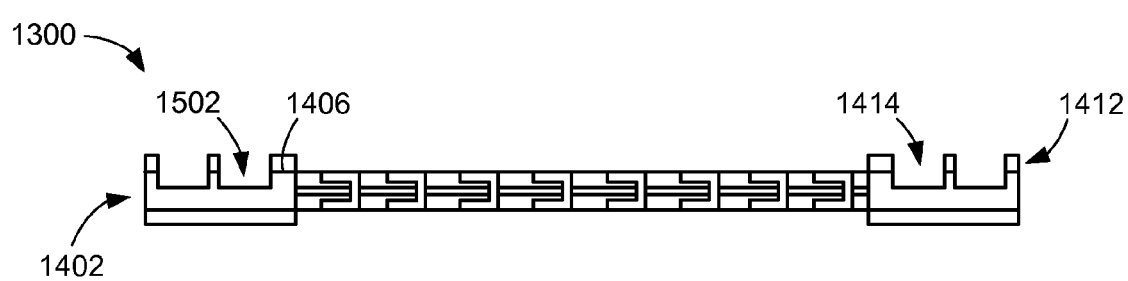
FIG. 15 is the structure of FIG. 14 in a partial carrier removal phase.

Referring now to FIG. 15, therein is shown the structure of FIG. 14 in a partial carrier removal phase. The integrated circuit packaging system 1300 can include a removal process including etching in the partial carrier removal phase. A portion of the package carrier 1402 at the carrier top side 1406 that is exposed from the top resist layer 1412 and below the resist cavity 1414 can be removed to form a carrier partially removed region 1502 in the package carrier 1402. The carrier partially removed region 1502 can be at or below the carrier top side 1406.

Figure 16:
FIG. 16 is the structure of FIG. 15 in a pad-forming phase.

Referring now to FIG. 16, therein is shown the structure of FIG. 15 in a pad-forming phase. The integrated circuit packaging system 1300 can include a pad forming process including plating. The outer contact pad 1314 can be formed directly on the carrier partially removed region 1502 for connectivity to an external system.

Figure 17:
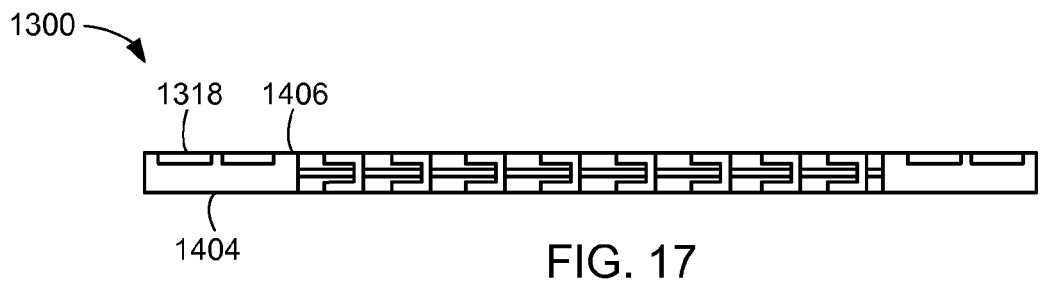
FIG. 17 is the structure of FIG. 16 in a resist removal phase.

Referring now to FIG. 17, therein is shown the structure of FIG. 16 in a resist removal phase. The bottom resist layer 1410 of FIG. 14 and the top resist layer 1412 of FIG. 14 can be removed exposing the carrier bottom side 1404 and the carrier top side 1406, respectively. The outer pad top side 1318 can be coplanar with the carrier top side 1406.

Figure 18:
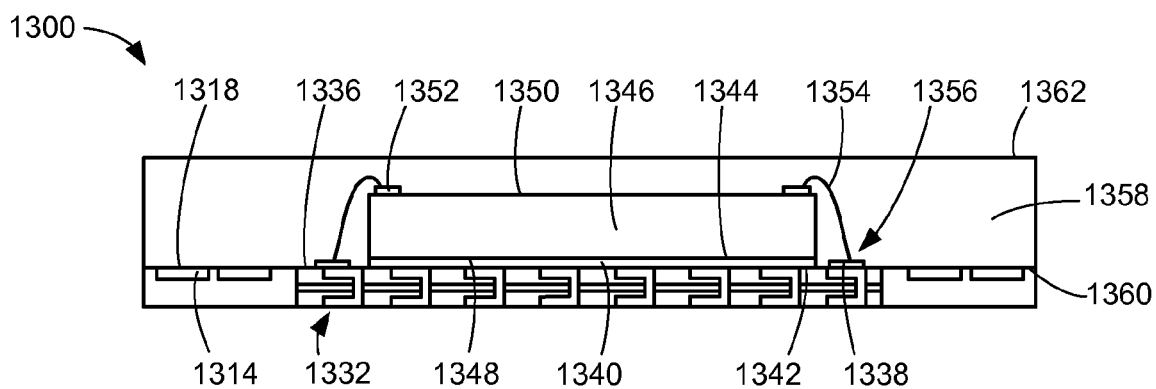
FIG. 18 is the structure of FIG. 17 in a molding phase.

Referring now to FIG. 18, therein is shown the structure of FIG. 17 in a molding phase. The integrated circuit packaging system 1300 can include the attach layer 1340 having the attach bottom side 1342 attached over or directly on the substrate top side 1336. The attach layer 1340 can be attached over a portion of the substrate top side 1336 that is adjacent or between the substrate pad 1338 and another of the substrate pad 1338.

The integrated circuit 1346 can include the inactive side 1348 facing and directly on the attach top side 1344. The integrated circuit 1346 can include the terminal 1352 at the active side 1350 connected or attached to the substrate pad 1338.

The integrated circuit packaging system 1300 can include a connector attachment process including wire bonding to attach the device connector 1354 to the terminal 1352 and the substrate pad 1338. The connector lower end 1356 of the device connector 1354 can be connected or attached to the substrate pad 1338.

The integrated circuit packaging system 1300 can include the encapsulation 1358 molded over the outer contact pad 1314, the package substrate 1332, the attach layer 1340, the integrated circuit 1346, and the device connector 1354. The encapsulation 1358 can be formed covering the outer pad top side 1318, the substrate top side 1336, the attach layer 1340, the integrated circuit 1346, and the device connector 1354.

The encapsulation 1358 can include the encapsulation bottom side 1360 and the encapsulation top side 1362. At least two of the encapsulation bottom side 1360, the outer pad top side 1318, the substrate top side 1336, and the attach bottom side 1342 can be coplanar with each other.

Figure 19:
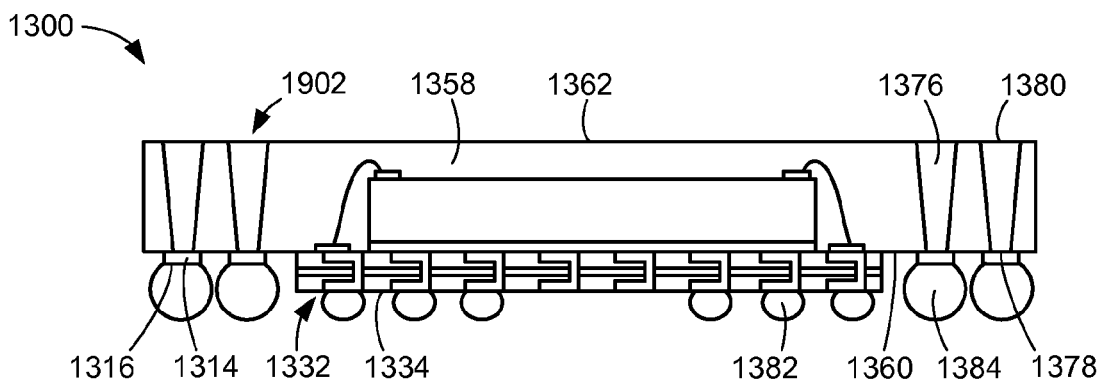
FIG. 19 is the structure of FIG. 18 in a connector-attaching phase.

Referring now to FIG. 19, therein is shown the structure of FIG. 18 in a connector-attaching phase. The integrated circuit packaging system 1300 can include a hole formation process including laser, drilling, etching, or a mold chase with a protrusion. An encapsulation hole 1902 of the encapsulation 1358 can be formed through the encapsulation 1358.

A number of the encapsulation hole 1902 can be formed above the outer contact pad 1314. For example, the encapsulation hole 1902 can be formed to provide z-interconnection in a subsequent phase for a molded laser package-on-package (MLP).

The integrated circuit packaging system 1300 can include a conductor filling process including plating or screen-printing. The encapsulation hole 1902 can be filled with an electrically conductive material including a metallic material or a metal alloy to form the vertical interconnect 1376. For example, the vertical interconnect 1376 can be formed to provide z-interconnection.

The vertical interconnect 1376 can be formed between the encapsulation bottom side 1360 and the encapsulation top side 1362. The interconnect bottom side 1378 and the interconnect top side 1380 can be coplanar with the encapsulation bottom side 1360 and the encapsulation top side 1362, respectively. The interconnect top side 1380 can be exposed from the encapsulation 1358.

The package carrier 1402 of FIG. 14 can be removed exposing the outer contact pad 1314 and the encapsulation bottom side 1360 to attach the outer external connector 1384. The integrated circuit packaging system 1300 can include a connector attachment method including bump attach. The inner external connector 1382 and the outer external connector 1384 can be connected or attached to the substrate bottom side 1334 and the outer pad bottom side 1316, respectively.

The outer contact pad 1314 can be formed protruding from or below a molding line, such as the encapsulation bottom side 1360, for connectivity to an external system. A number of the outer external connector 1384 attached to the outer contact pad 1314 can be formed surrounding a number of the inner external connector 1382 and the package substrate 1332.

Figure 20:
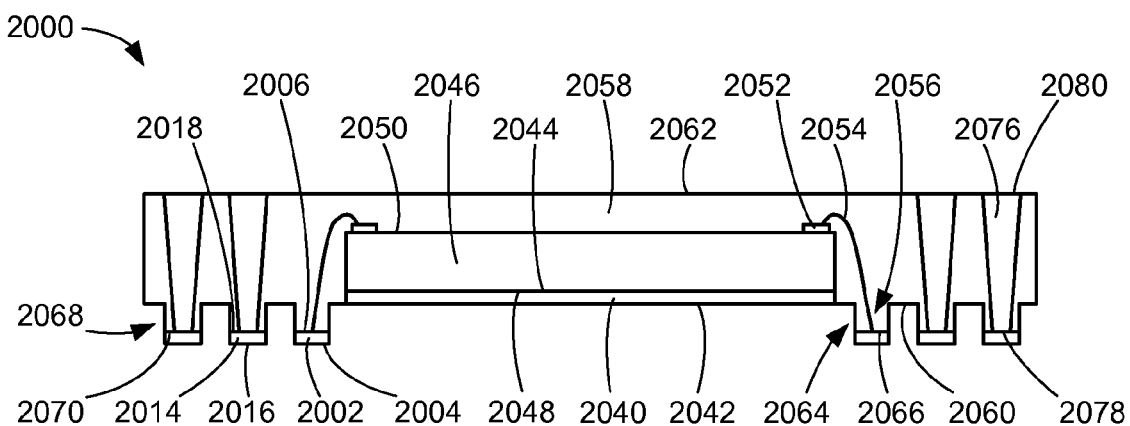
FIG. 20 is a cross-sectional view of an integrated circuit packaging system in a third embodiment of the present invention.

Referring now to FIG. 20, therein is shown a cross-sectional view of an integrated circuit packaging system 2000 in a third embodiment of the present invention. The integrated circuit packaging system 2000 can be similar to the integrated circuit packaging system 100 of FIG. 1, except for the formation of the inner contact pad 102 of FIG. 1, the outer contact pad 114 of FIG. 1, the device connector 154 of FIG. 1, the encapsulation 158 of FIG. 1, and the vertical interconnect 176 of FIG. 1, and without the inner external connector 182 of FIG. 1 and the outer external connector 184 of FIG. 1.

The integrated circuit packaging system 2000 can include an inner contact pad 2002, which is a pad closest to a semiconductor device and formed with an electrically conductive material to which an electrical connector is attached. The inner contact pad 2002 can include an inner pad bottom side 2004 and an inner pad top side 2006 at an opposite side to the inner pad bottom side 2004.

The integrated circuit packaging system 2000 can include an outer contact pad 2014, which is a pad further from a semiconductor device than the inner contact pad 2002 and formed with an electrically conductive material to which an electrical connector is attached. The outer contact pad 2014 can include an outer pad bottom side 2016 and an outer pad top side 2018 at an opposite side to the outer pad bottom side 2016. The outer contact pad 2014 can be adjacent or next to the inner contact pad 2002.

The outer pad bottom side 2016 can be coplanar with the inner pad bottom side 2004. The outer pad top side 2018 can be coplanar with the inner pad top side 2006.

The integrated circuit packaging system 2000 can include an attach layer 2040 having an attach bottom side 2042 and an attach top side 2044. The integrated circuit packaging system 2000 can include an integrated circuit 2046 having an inactive side 2048, an active side 2050, and a terminal 2052. The attach layer 2040 and the integrated circuit 2046 can be formed in a manner similar to the attach layer 140 of FIG. 1 and the integrated circuit 146 of FIG. 1, respectively.

The integrated circuit packaging system 2000 can include a device connector 2054, which is an electrically conductive connector, attached to the integrated circuit 2046 and the inner contact pad 2002. The device connector 2054 can be connected or attached to the terminal 2052 and the inner contact pad 2002. A connector lower end 2056 of the device connector 2054 can be connected or attached to the inner pad top side 2006.

For illustrative purposes, the device connector 2054 is shown as a bond wire, although it is understood that the device connector 2054 can include any other electrically conductive connector. For example, the device connector 2054 can be a conductive bump.

The integrated circuit packaging system 2000 can include an encapsulation 2058, which is a cover for a semiconductor package to seal a semiconductor device providing mechanical and environmental protection. The encapsulation 2058 can be molded over the inner contact pad 2002, the outer contact pad 2014, the attach layer 2040, the integrated circuit 2046, and the device connector 2054. The encapsulation 2058 can be formed covering the inner pad top side 2006, the outer pad top side 2018, the attach layer 2040, the integrated circuit 2046, and the device connector 2054.

The encapsulation 2058 can include an encapsulation bottom side 2060 and an encapsulation top side 2062 at an opposite side to the encapsulation bottom side 2060. The encapsulation bottom side 2060 can be coplanar with the attach bottom side 2042. The encapsulation bottom side 2060 can be above the inner pad top side 2006 and the outer pad top side 2018.

The encapsulation 2058 can include an encapsulation inner protrusion 2064 having an inner protrusion bottom side 2066. The encapsulation inner protrusion 2064 protrudes from the encapsulation bottom side 2060 with the inner protrusion bottom side 2066 below the encapsulation bottom side 2060.

The inner protrusion bottom side 2066 can be directly on the inner pad top side 2006. The connector lower end 2056 can be covered with the encapsulation 2058 and in the encapsulation inner protrusion 2064.

The encapsulation 2058 can include an encapsulation outer protrusion 2068 having an outer protrusion bottom side 2070. The encapsulation outer protrusion 2068 protrudes from the encapsulation bottom side 2060 with the outer protrusion bottom side 2070 below the encapsulation bottom side 2060.

A number of the encapsulation outer protrusion 2068 can be formed adjacent or surrounding a number of the encapsulation inner protrusion 2064. The outer protrusion bottom side 2070 can be directly on the outer pad top side 2018.

The integrated circuit packaging system 2000 can include a vertical interconnect 2076, which is an electrically conductive connector. The vertical interconnect 2076 can be formed through the encapsulation 2058.

The vertical interconnect 2076 can be formed vertically between the outer protrusion bottom side 2070 and the encapsulation top side 2062. A lower extent of the vertical interconnect 2076 can be covered with the encapsulation 2058 and in the encapsulation outer protrusion 2068.

The vertical interconnect 2076 can include an interconnect bottom side 2078 and an interconnect top side 2080 at an opposite side to the interconnect bottom side 2078. The interconnect bottom side 2078 and the interconnect top side 2080 can be coplanar with the outer protrusion bottom side 2070 and the encapsulation top side 2062, respectively. The interconnect bottom side 2078 can be directly on the outer pad top side 2018.

The vertical interconnect 2076 can be partially exposed from the encapsulation 2058. The interconnect top side 2080 can be exposed from the encapsulation 2058.

A width of the interconnect bottom side 2078 can be less than a width of the interconnect top side 2080, a width of the outer pad top side 2018, or a combination thereof. Widths of the interconnect bottom side 2078, the interconnect top side 2080, and the outer pad top side 2018 are horizontal distances between horizontal extents of the interconnect bottom side 2078, the interconnect top side 2080, and the outer pad top side 2018, respectively.

For illustrative purposes, the vertical interconnect 2076 is shown having a conical shape, although it is understood that the vertical interconnect 2076 can include any other shape. For example, the vertical interconnect 2076 can include a rectangular shape.

The integrated circuit packaging system 2000 can include an external connector (not shown) connected or attached to the inner pad bottom side 2004. The integrated circuit packaging system 2000 can include another external connector connected or attached to the outer pad bottom side 2016.

It has been discovered that the inner contact pad 2002 directly on the encapsulation inner protrusion 2064 and the outer contact pad 2014 directly on the encapsulation outer protrusion 2068 provide more contact areas for connectivity to an external system.

Figure 21:
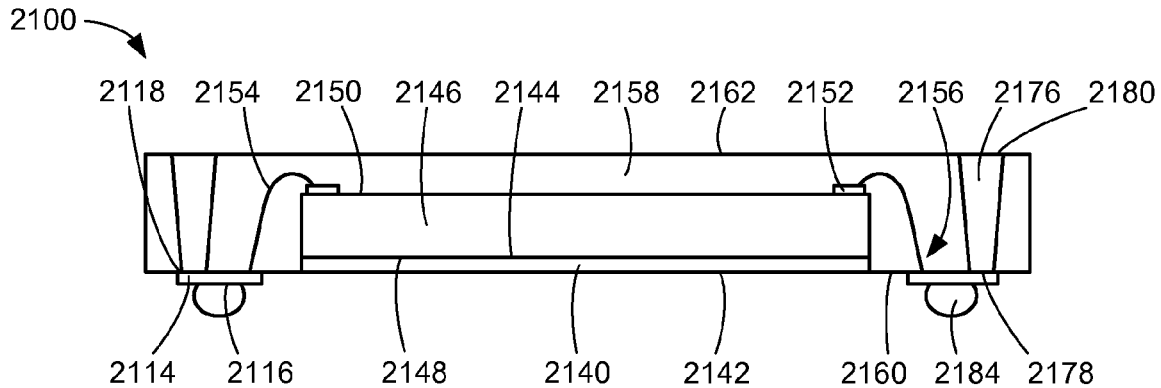
FIG. 21 is a cross-sectional view of an integrated circuit packaging system in a fourth embodiment of the present invention.

Referring now to FIG. 21, therein is shown a cross-sectional view of an integrated circuit packaging system 2100 in a fourth embodiment of the present invention. The integrated circuit packaging system 2100 can be similar to the integrated circuit packaging system 100 of FIG. 1, except for the formation of the device connector 154 of FIG. 1 and without the inner contact pad 102 of FIG. 1 and the inner external connector 182 of FIG. 1.

The integrated circuit packaging system 2100 can include an outer contact pad 2114 having an outer pad bottom side 2116 and an outer pad top side 2118. The outer contact pad 2114 can be formed in a manner similar to the outer contact pad 114 of FIG. 1.

The integrated circuit packaging system 2100 can include an attach layer 2140 having an attach bottom side 2142 and an attach top side 2144. The integrated circuit packaging system 2100 can include an integrated circuit 2146 having an inactive side 2148, an active side 2150, and a terminal 2152. The attach layer 2140 and the integrated circuit 2146 can be formed in a manner similar to the attach layer 140 of FIG. 1 and the integrated circuit 146 of FIG. 1, respectively.

The integrated circuit packaging system 2100 can include a device connector 2154, which is an electrically conductive connector, attached to the integrated circuit 2146 and the outer contact pad 2114. The device connector 2154 can be connected or attached to the terminal 2152 and the outer contact pad 2114. A connector lower end 2156 of the device connector 2154 can be connected or attached to the outer pad top side 2118.

For illustrative purposes, the device connector 2154 is shown as a bond wire, although it is understood that the device connector 2154 can include any other electrically conductive connector. For example, the device connector 2154 can be a conductive bump.

The integrated circuit packaging system 2100 can include an encapsulation 2158 having an encapsulation bottom side 2160 and an encapsulation top side 2162. The integrated circuit packaging system 2100 can include a vertical interconnect 2176 having an interconnect bottom side 2178 and an interconnect top side 2180. The encapsulation 2158 and the vertical interconnect 2176 can be formed in a manner similar to the encapsulation 158 of FIG. 1 and the vertical interconnect 176 of FIG. 1, respectively.

The integrated circuit packaging system 2100 can include an outer external connector 2184. The outer external connector 2184 can be formed in a manner similar to the outer external connector 184 of FIG. 1.

It has been discovered that the outer contact pad 2114 attached to the device connector 2154 and the vertical interconnect 2176 provides electrical connectivity between the integrated circuit 2146 and an external system.

Figure 22:
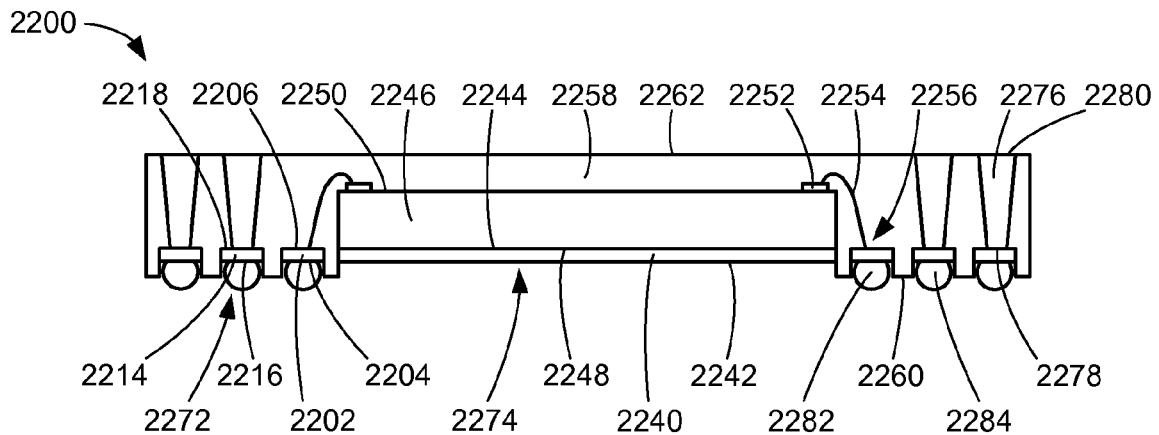
FIG. 22 is a cross-sectional view of an integrated circuit packaging system in a fifth embodiment of the present invention.

Referring now to FIG. 22, therein is shown a cross-sectional view of an integrated circuit packaging system 2200 in a fifth embodiment of the present invention. The integrated circuit packaging system 2200 can be similar to the integrated circuit packaging system 100 of FIG. 1, except for the formation of the inner contact pad 102 of FIG. 1, the outer contact pad 114 of FIG. 1, the attach layer 140 of FIG. 1, the encapsulation 158 of FIG. 1, the inner external connector 182 of FIG. 1, and the outer external connector 184 of FIG. 1.

The integrated circuit packaging system 2200 can include an inner contact pad 2202, which is a pad closest to a semiconductor device and formed with an electrically conductive material to which an electrical connector is attached. The inner contact pad 2202 can include an inner pad bottom side 2204 and an inner pad top side 2206 at an opposite side to the inner pad bottom side 2204.

The integrated circuit packaging system 2200 can include an outer contact pad 2214, which is a pad further from a semiconductor device than the inner contact pad 2202 and formed with an electrically conductive material to which an electrical connector is attached. The outer contact pad 2214 can include an outer pad bottom side 2216 and an outer pad top side 2218 at an opposite side to the outer pad bottom side 2216. The outer contact pad 2214 can be adjacent or next to the inner contact pad 2202.

The outer pad bottom side 2216 can be coplanar with the inner pad bottom side 2204. The outer pad top side 2218 can be coplanar with the inner pad top side 2206.

The integrated circuit packaging system 2200 can include an attach layer 2240, which is a layer of a material that is used to support and mount a semiconductor device. The attach layer 2240 can include an attach bottom side 2242 and an attach top side 2244 at an opposite side to the attach bottom side 2242. The inner pad bottom side 2204 or the outer pad bottom side 2216 can be at or coplanar with the attach bottom side 2242. For example, the attach layer 2240 can include a die attach material.

For illustrative purposes, the attach bottom side 2242 is shown coplanar with the inner pad bottom side 2204 or the outer pad bottom side 2216, although it is understood that the attach bottom side 2242, the inner pad bottom side 2204, and the outer pad bottom side 2216 can be at different planes. For example, the attach bottom side 2242 can be above the inner pad bottom side 2204 or the outer pad bottom side 2216.

The integrated circuit packaging system 2200 can include an integrated circuit 2246 having an inactive side 2248, an active side 2250, and a terminal 2252. The integrated circuit packaging system 2200 can include a device connector 2254 having a connector lower end 2256. The integrated circuit 2246 and the device connector 2254 can be formed in a manner similar to the integrated circuit 146 of FIG. 1 and the device connector 154 of FIG. 1, respectively.

The integrated circuit packaging system 2200 can include an encapsulation 2258, which is a cover for a semiconductor package to seal a semiconductor device providing mechanical and environmental protection. The encapsulation 2258 can be molded over the inner contact pad 2202, the outer contact pad 2214, the attach layer 2240, the integrated circuit 2246, and the device connector 2254. The encapsulation 2258 can be formed covering the inner pad top side 2206, the outer pad top side 2218, the attach layer 2240, the integrated circuit 2246, and the device connector 2254.

The encapsulation 2258 can include an encapsulation bottom side 2260 and an encapsulation top side 2262 at an opposite side to the encapsulation bottom side 2260. The encapsulation bottom side 2260 can be below at least one of the inner pad bottom side 2204, the outer pad bottom side 2216, and the attach bottom side 2242.

The encapsulation 2258 can include an encapsulation cavity 2272, which is a depression in the encapsulation 2258 at the encapsulation bottom side 2260. A number of the encapsulation cavity 2272 can be adjacent, along, or within a periphery of the encapsulation 2258.

The encapsulation 2258 can include an encapsulation recess 2274, which is a depression in the encapsulation 2258 at the encapsulation bottom side 2260. The encapsulation recess 2274 can be at a central portion of the encapsulation 2258 at the encapsulation bottom side 2260. The encapsulation recess 2274 can be surrounded by a number of the encapsulation cavity 2272. The encapsulation recess 2274 can expose the attach bottom side 2242.

The integrated circuit packaging system 2200 can include a vertical interconnect 2276 having an interconnect bottom side 2278 and an interconnect top side 2280. The vertical interconnect 2276 can be formed in a manner similar to the vertical interconnect 176 of FIG. 1.

The integrated circuit packaging system 2200 can include an inner external connector 2282, which is an electrically conductive connector, connected or attached to the inner contact pad 2202. The inner external connector 2282 can be attached to the inner pad bottom side 2204.

The inner contact pad 2202 and a top extent of the inner external connector 2282 can be within the encapsulation cavity 2272. A bottom extent of the inner external connector 2282 can be outside of the encapsulation cavity 2272 or below the encapsulation bottom side 2260.

The integrated circuit packaging system 2200 can include an outer external connector 2284, which is an electrically conductive connector, connected or attached to the outer contact pad 2214. The outer external connector 2284 can be attached to the outer pad bottom side 2216.

The outer contact pad 2214 and a top extent of the outer external connector 2284 can be within another of the encapsulation cavity 2272. A bottom extent of the outer external connector 2284 can be outside of another of the encapsulation cavity 2272 or below the encapsulation bottom side 2260.

It has been discovered that the inner contact pad 2202 and the outer contact pad 2214 within the encapsulation cavity 2272 improves alignment for attachment of the inner external connector 2282 and the outer external connector 2284, respectively.

Figure 23:
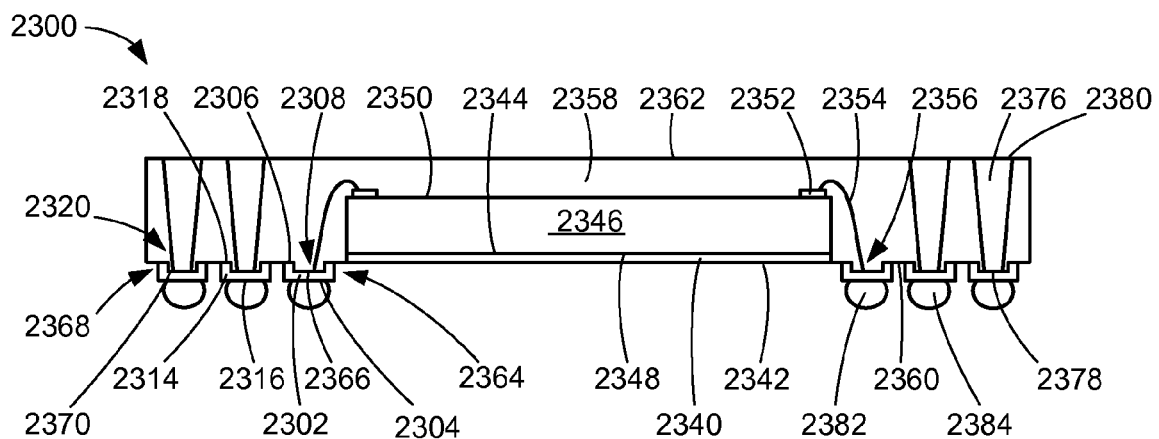
FIG. 23 is a cross-sectional view of an integrated circuit packaging system in a sixth embodiment of the present invention.

Referring now to FIG. 23, therein is shown a cross-sectional view of an integrated circuit packaging system 2300 in a sixth embodiment of the present invention. The integrated circuit packaging system 2300 can be similar to the integrated circuit packaging system 100 of FIG. 1, except for the formation of the inner contact pad 102 of FIG. 1, the outer contact pad 114 of FIG. 1, the device connector 154 of FIG. 1, the encapsulation 158 of FIG. 1, and the vertical interconnect 176 of FIG. 1.

The integrated circuit packaging system 2300 can include an inner contact pad 2302, which is a pad closest to a semiconductor device and formed with an electrically conductive material to which an electrical connector is attached. The inner contact pad 2302 can include an inner pad bottom side 2304 and an inner pad top side 2306 at an opposite side to the inner pad bottom side 2304. The inner contact pad 2302 can include an inner pad recess 2308, which is a depression in the inner contact pad 2302 at the inner pad top side 2306.

The integrated circuit packaging system 2300 can include an outer contact pad 2314, which is a pad further from a semiconductor device than the inner contact pad 2302 and formed with an electrically conductive material to which an electrical connector is attached. The outer contact pad 2314 can include an outer pad bottom side 2316 and an outer pad top side 2318 at an opposite side to the outer pad bottom side 2316. The outer contact pad 2314 can be adjacent or next to the inner contact pad 2302. The outer contact pad 2314 can include an outer pad recess 2320, which is a depression in the outer contact pad 2314 at the outer pad top side 2318.

The outer pad bottom side 2316 can be coplanar with the inner pad bottom side 2304. The outer pad top side 2318 can be coplanar with the inner pad top side 2306.

The integrated circuit packaging system 2300 can include an attach layer 2340 having an attach bottom side 2342 and an attach top side 2344. The integrated circuit packaging system 2300 can include an integrated circuit 2346 having an inactive side 2348, an active side 2350, and a terminal 2352. The attach layer 2340 and the integrated circuit 2346 can be formed in a manner similar to the attach layer 140 of FIG. 1 and the integrated circuit 146 of FIG. 1, respectively.

The integrated circuit packaging system 2300 can include a device connector 2354, which is an electrically conductive connector, attached to the integrated circuit 2346 and the inner contact pad 2302. The device connector 2354 can be connected or attached to the terminal 2352 and the inner contact pad 2302.

A connector lower end 2356 of the device connector 2354 can be connected or attached to the inner contact pad 2302. The connector lower end 2356 can be within the inner pad recess 2308.

For illustrative purposes, the device connector 2354 is shown as a bond wire, although it is understood that the device connector 2354 can include any other electrically conductive connector. For example, the device connector 2354 can be a conductive bump.

The integrated circuit packaging system 2300 can include an encapsulation 2358, which is a cover for a semiconductor package to seal a semiconductor device providing mechanical and environmental protection. The encapsulation 2358 can be molded over the inner contact pad 2302, the outer contact pad 2314, the attach layer 2340, the integrated circuit 2346, and the device connector 2354.

The encapsulation 2358 can be formed covering the inner pad top side 2306, the outer pad top side 2318, the attach layer 2340, the integrated circuit 2346, and the device connector 2354. The encapsulation 2358 can be formed within the inner pad recess 2308 and the outer pad recess 2320.

The encapsulation 2358 can include an encapsulation bottom side 2360 and an encapsulation top side 2362 at an opposite side to the encapsulation bottom side 2360. At least two of the encapsulation bottom side 2360, the inner pad top side 2306, the outer pad top side 2318, and the attach bottom side 2342 can be coplanar with each other.

The encapsulation 2358 can include an encapsulation inner protrusion 2364 having an inner protrusion bottom side 2366. The encapsulation inner protrusion 2364 protrudes from the encapsulation bottom side 2360 with the inner protrusion bottom side 2366 below the encapsulation bottom side 2360.

The inner protrusion bottom side 2366 can be directly on the inner contact pad 2302 and within the inner pad recess 2308. The connector lower end 2356 can be covered with the encapsulation 2358 in the encapsulation inner protrusion 2364.

The encapsulation 2358 can include an encapsulation outer protrusion 2368 having an outer protrusion bottom side 2370. The encapsulation outer protrusion 2368 protrudes from the encapsulation bottom side 2360 with the outer protrusion bottom side 2370 below the encapsulation bottom side 2360.

A number of the encapsulation outer protrusion 2368 can be formed adjacent or surrounding a number of the encapsulation inner protrusion 2364. The outer protrusion bottom side 2370 can be directly on the outer contact pad 2314 and within the outer pad recess 2320.

The integrated circuit packaging system 2300 can include a vertical interconnect 2376, which is an electrically conductive connector. The vertical interconnect 2376 can be formed through the encapsulation 2358. The vertical interconnect 2376 can be formed vertically between the outer protrusion bottom side 2370 and the encapsulation top side 2362.

A lower extent of the vertical interconnect 2376 can be covered with the encapsulation 2358 and in the encapsulation outer protrusion 2368. The lower extent of the vertical interconnect 2376 can be within the outer pad recess 2320.

The vertical interconnect 2376 can include an interconnect bottom side 2378 and an interconnect top side 2380 at an opposite side to the interconnect bottom side 2378. The interconnect bottom side 2378 and the interconnect top side 2380 can be coplanar with the outer protrusion bottom side 2370 and the encapsulation top side 2362, respectively. The interconnect bottom side 2378 can be directly on the outer contact pad 2314 and within the outer pad recess 2320.

The vertical interconnect 2376 can be partially exposed from the encapsulation 2358. The interconnect top side 2380 can be exposed from the encapsulation 2358.

A width of the interconnect bottom side 2378 can be less than a width of the interconnect top side 2380, a width of the outer pad top side 2318, or a combination thereof. Widths of the interconnect bottom side 2378, the interconnect top side 2380, and the outer pad top side 2318 are horizontal distances between horizontal extents of the interconnect bottom side 2378, the interconnect top side 2380, and the outer pad top side 2318, respectively.

For illustrative purposes, the vertical interconnect 2376 is shown having a conical shape, although it is understood that the vertical interconnect 2376 can include any other shape. For example, the vertical interconnect 2376 can include a rectangular shape.

The integrated circuit packaging system 2300 can include an inner external connector 2382 and an outer external connector 2384. The inner external connector 2382 and the outer external connector 2384 can be formed in a manner similar to the inner external connector 182 of FIG. 1 and the outer external connector 184 of FIG. 1, respectively.

It has been discovered that the inner contact pad 2302 having the inner pad recess 2308 and the outer contact pad 2314 having the outer pad recess 2320 provide more contact areas for connectivity to an external system with the inner contact pad 2302 and the outer contact pad 2314 protruding from the encapsulation bottom side 2360.

Figure 24:
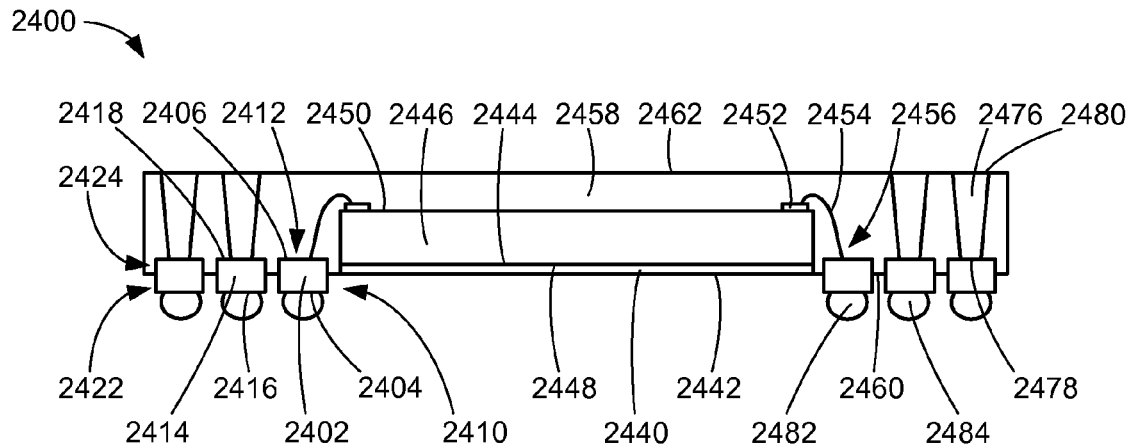
FIG. 24 is a cross-sectional view of an integrated circuit packaging system in a seventh embodiment of the present invention.

Referring now to FIG. 24, therein is shown a cross-sectional view of an integrated circuit packaging system 2400 in a seventh embodiment of the present invention. The integrated circuit packaging system 2400 can be similar to the integrated circuit packaging system 100 of FIG. 1, except for the formation of the inner contact pad 102 of FIG. 1, the outer contact pad 114 of FIG. 1, the attach layer 140 of FIG. 1, the encapsulation 158 of FIG. 1, and the vertical interconnect 176 of FIG. 1.

The integrated circuit packaging system 2400 can include an inner contact pad 2402, which is a pad closest to a semiconductor device and formed with an electrically conductive material to which an electrical connector is attached. The inner contact pad 2402 can include an inner pad bottom side 2404 and an inner pad top side 2406 at an opposite side to the inner pad bottom side 2404.

The inner contact pad 2402 can include an inner pad lower end 2410 and an inner pad upper end 2412 opposite or above the inner pad lower end 2410. The inner pad bottom side 2404 and the inner pad top side 2406 can include a bottom extent of the inner pad lower end 2410 and a top extent of the inner pad upper end 2412, respectively.

The inner pad lower end 2410 can be approximately as wide as the inner pad upper end 2412. In other words, a width of the inner pad lower end 2410 can be approximately equal to a width of the inner pad upper end 2412. Widths of the inner pad lower end 2410 and the inner pad upper end 2412 are horizontal distances between horizontal extents of the inner pad lower end 2410 and the inner pad upper end 2412, respectively.

The integrated circuit packaging system 2400 can include an outer contact pad 2414, which is a pad further from a semiconductor device than the inner contact pad 2402 and formed with an electrically conductive material to which an electrical connector is attached. The outer contact pad 2414 can include an outer pad bottom side 2416 and an outer pad top side 2418 at an opposite side to the outer pad bottom side 2416. The outer contact pad 2414 can be adjacent or next to the inner contact pad 2402.

The outer contact pad 2414 can include an outer pad lower end 2422 and an outer pad upper end 2424 opposite or above the outer pad lower end 2422. The outer pad bottom side 2416 and the outer pad top side 2418 can include a bottom extent of the outer pad lower end 2422 and a top extent of the outer pad upper end 2424, respectively.

The outer pad lower end 2422 can be approximately as wide as the outer pad upper end 2424. In other words, a width of the outer pad lower end 2422 can be approximately equal to a width of the outer pad upper end 2424. Widths of the outer pad lower end 2422 and the outer pad upper end 2424 are horizontal distances between horizontal extents of the outer pad lower end 2422 and the outer pad upper end 2424, respectively.

The outer pad bottom side 2416 can be coplanar with the inner pad bottom side 2404. The outer pad top side 2418 can be coplanar with the inner pad top side 2406.

The integrated circuit packaging system 2400 can include an attach layer 2440, which is a layer of a material that is used to support and mount a semiconductor device. For example, the attach layer 2440 can include a die attach material.

The attach layer 2440 can include an attach bottom side 2442 and an attach top side 2444 at an opposite side to the attach bottom side 2442. The attach bottom side 2442 can be above the inner pad bottom side 2404, the outer pad bottom side 2416, or a combination thereof.

The integrated circuit packaging system 2400 can include an integrated circuit 2446 having an inactive side 2448, an active side 2450, and a terminal 2452. The integrated circuit 2446 can be formed in a manner similar to the integrated circuit 146 of FIG. 1.

The integrated circuit 2446 and the attach layer 2440 can be above the inner contact pad 2402 and the outer contact pad 2414. The integrated circuit 2446 and the attach layer 2440 can be surrounded by a number of the inner contact pad 2402 and the outer contact pad 2414.

The inner contact pad 2402 can be between the outer contact pad 2414 and the integrated circuit 2446 or between the outer contact pad 2414 and the attach layer 2440. The inner contact pad 2402 can be closer to the integrated circuit 2446 and the attach layer 2440 than the outer contact pad 2414.

The integrated circuit packaging system 2400 can include a device connector 2454 having a connector lower end 2456. The device connector 2454 can be formed in a manner similar to the device connector 154 of FIG. 1. The connector lower end 2456 can be connected or attached to the inner pad top side 2406 or a top extent of the inner pad upper end 2412.

The integrated circuit packaging system 2400 can include an encapsulation 2458, which is a cover for a semiconductor package to seal a semiconductor device providing mechanical and environmental protection. The encapsulation 2458 can be molded over the inner contact pad 2402, the outer contact pad 2414, the attach layer 2440, the integrated circuit 2446, and the device connector 2454. The encapsulation 2458 can be formed covering the inner pad upper end 2412, the outer pad upper end 2424, the attach layer 2440, the integrated circuit 2446, and the device connector 2454.

The encapsulation 2458 can include an encapsulation bottom side 2460 and an encapsulation top side 2462 at an opposite side to the encapsulation bottom side 2460. The encapsulation bottom side 2460 can be coplanar with the attach bottom side 2442. The encapsulation bottom side 2460 can be below the inner pad top side 2406 and the outer pad top side 2418.

The inner pad lower end 2410 and the outer pad lower end 2422 can be exposed from the encapsulation 2458. The inner pad lower end 2410 and the outer pad lower end 2422 can protrude from the encapsulation bottom side 2460. The inner pad bottom side 2404 and the outer pad bottom side 2416 can be below the encapsulation bottom side 2460.

The integrated circuit packaging system 2400 can include a vertical interconnect 2476, which is an electrically conductive connector. The vertical interconnect 2476 can be formed through the encapsulation 2458. The vertical interconnect 2476 can be formed vertically between the outer pad top side 2418 and the encapsulation top side 2462.

The vertical interconnect 2476 can include an interconnect bottom side 2478 and an interconnect top side 2480 at an opposite side to the interconnect bottom side 2478. The interconnect top side 2480 can be coplanar with the encapsulation top side 2462. The interconnect bottom side 2478 can be directly on the outer pad top side 2418.

The vertical interconnect 2476 can be partially exposed from the encapsulation 2458. The interconnect top side 2480 can be exposed from the encapsulation 2458.

A width of the interconnect bottom side 2478 can be less than a width of the interconnect top side 2480, a width of the outer pad top side 2418, or a combination thereof. Widths of the interconnect bottom side 2478, the interconnect top side 2480, and the outer pad top side 2418 are horizontal distances between horizontal extents of the interconnect bottom side 2478, the interconnect top side 2480, and the outer pad top side 2418, respectively.

For illustrative purposes, the vertical interconnect 2476 is shown having a conical shape, although it is understood that the vertical interconnect 2476 can include any other shape. For example, the vertical interconnect 2476 can include a rectangular shape.

The integrated circuit packaging system 2400 can include an inner external connector 2482 and an outer external connector 2484. The inner external connector 2482 and the outer external connector 2484 can be formed in a manner similar to the inner external connector 182 of FIG. 1 and the outer external connector 184 of FIG. 1, respectively.

It has been discovered that the inner contact pad 2402 and the outer contact pad 2414 provide more contact areas for connectivity to an external system with the inner pad lower end 2410 and the outer pad lower end 2422 protruding from the encapsulation bottom side 2460.

Figure 25:
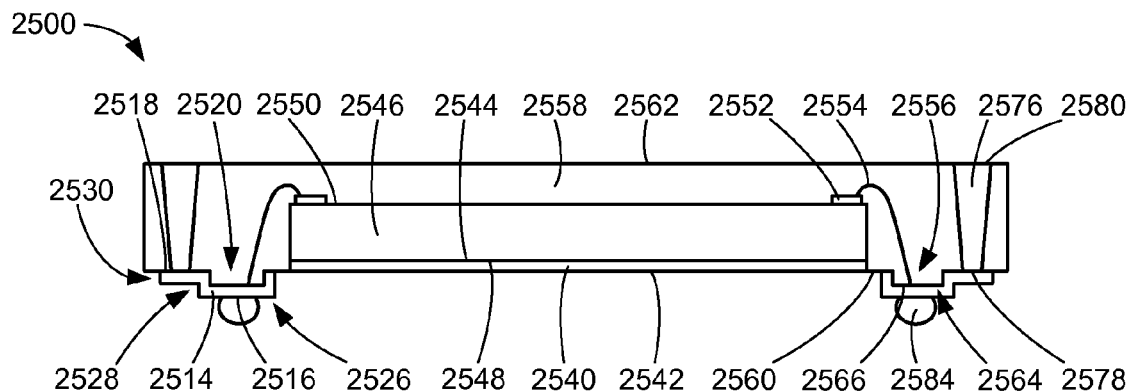
FIG. 25 is a cross-sectional view of an integrated circuit packaging system in an eighth embodiment of the present invention.

Referring now to FIG. 25, therein is shown a cross-sectional view of an integrated circuit packaging system 2500 in an eighth embodiment of the present invention. The integrated circuit packaging system 2500 can be similar to the integrated circuit packaging system 100 of FIG. 1, except for the formation of the outer contact pad 114 of FIG. 1, the device connector 154 of FIG. 1, the encapsulation 158 of FIG. 1, the vertical interconnect 176 of FIG. 1, and the outer external connector 184 of FIG. 1, and without the inner contact pad 102 of FIG. 1 and the inner external connector 182 of FIG. 1.

The integrated circuit packaging system 2500 can include an outer contact pad 2514, which is a pad formed with an electrically conductive material to which an electrical connector is attached. The outer contact pad 2514 can include an outer pad bottom side 2516 and an outer pad top side 2518 opposite or above the outer pad bottom side 2516.

The outer contact pad 2514 can include an outer pad recess 2520 at the outer pad top side 2518. The outer contact pad 2514 can include an outer pad base segment 2526, an outer pad connection segment 2528, and an outer pad overhang segment 2530, which are lower, middle, and upper portions of the outer contact pad 2514, respectively. The outer pad base segment 2526, the outer pad connection segment 2528, and the outer pad overhang segment 2530 can be formed as an integral structure with a common material.

A top extent of the outer pad base segment 2526 can bound a bottom extent of the outer pad recess 2520. The outer pad connection segment 2528 can bound horizontal extents of the outer pad recess 2520.

A horizontal extent of the outer pad overhang segment 2530 can be connected or attached to a horizontal extent of the outer pad base segment 2526 with the outer pad connection segment 2528. The outer pad overhang segment 2530 can be above the outer pad base segment 2526.

A plane of a non-vertical side of the outer pad overhang segment 2530 can be parallel to a plane of a non-vertical side of the outer pad base segment 2526. The outer pad bottom side 2516 and the outer pad top side 2518 can include a bottom extent of the outer pad base segment 2526 and a top extent of the outer pad overhang segment 2530, respectively.

A plane of a non-horizontal side of the outer pad connection segment 2528 can intersect a plane of a non-vertical side of the outer pad overhang segment 2530 or a plane of a non-vertical side of the outer pad base segment 2526. A plane of a non-horizontal side of the outer pad connection segment 2528 can be perpendicular to a plane of a non-vertical side of the outer pad overhang segment 2530 or a plane of a non-vertical side of the outer pad base segment 2526.

The integrated circuit packaging system 2500 can include an attach layer 2540 having an attach bottom side 2542 and an attach top side 2544. The integrated circuit packaging system 2500 can include an integrated circuit 2546 having an inactive side 2548, an active side 2550, and a terminal 2552. The attach layer 2540 and the integrated circuit 2546 can be formed in a manner similar to the attach layer 140 of FIG. 1 and the integrated circuit 146 of FIG. 1, respectively.

The integrated circuit packaging system 2500 can include a device connector 2554, which is an electrically conductive connector, attached to the integrated circuit 2546 and the outer contact pad 2514. The device connector 2554 can be connected or attached to the terminal 2552 and the outer contact pad 2514. A connector lower end 2556 of the device connector 2554 can be connected or attached to a top extent of the outer pad base segment 2526.

For illustrative purposes, the device connector 2554 is shown as a bond wire, although it is understood that the device connector 2554 can include any other electrically conductive connector. For example, the device connector 2554 can be a conductive bump.

The integrated circuit packaging system 2500 can include an encapsulation 2558, which is a cover for a semiconductor package to seal a semiconductor device providing mechanical and environmental protection. The encapsulation 2558 can be molded over the outer contact pad 2514, the attach layer 2540, the integrated circuit 2546, and the device connector 2554. The encapsulation 2558 can be formed covering the outer pad top side 2518, a top extent of the outer pad base segment 2526, a horizontal extent of the outer pad connection segment 2528, the attach layer 2540, the integrated circuit 2546, and the device connector 2554.

The encapsulation 2558 can include an encapsulation bottom side 2560 and an encapsulation top side 2562 at an opposite side to the encapsulation bottom side 2560. At least two of the encapsulation bottom side 2560, the outer pad top side 2518, and the attach bottom side 2542 can be coplanar with each other.

The encapsulation 2558 can include an encapsulation protrusion 2564 having a protrusion bottom side 2566. The encapsulation protrusion 2564 protrudes from the encapsulation bottom side 2560 with the protrusion bottom side 2566 below the encapsulation bottom side 2560. The protrusion bottom side 2566 can be directly on a top extent of the outer pad base segment 2526.

The integrated circuit packaging system 2500 can include a vertical interconnect 2576, which is an electrically conductive connector. The vertical interconnect 2576 can be formed through the encapsulation 2558. The vertical interconnect 2576 can be formed vertically between the encapsulation bottom side 2560 and the encapsulation top side 2562.

The vertical interconnect 2576 can include an interconnect bottom side 2578 and an interconnect top side 2580 at an opposite side to the interconnect bottom side 2578. The interconnect bottom side 2578 and the interconnect top side 2580 can be coplanar with the encapsulation bottom side 2560 and the encapsulation top side 2562, respectively. The interconnect bottom side 2578 can be directly on the outer pad top side 2518 or a top extent of the outer pad overhang segment 2530.

The vertical interconnect 2576 can be partially exposed from the encapsulation 2558. The interconnect top side 2580 can be exposed from the encapsulation 2558.

A width of the interconnect bottom side 2578 can be less than a width of the interconnect top side 2580, a width of the outer pad top side 2518, or a combination thereof. Widths of the interconnect bottom side 2578, the interconnect top side 2580, and the outer pad top side 2518 are horizontal distances between horizontal extents of the interconnect bottom side 2578, the interconnect top side 2580, and the outer pad top side 2518, respectively.

For illustrative purposes, the vertical interconnect 2576 is shown having a conical shape, although it is understood that the vertical interconnect 2576 can include any other shape. For example, the vertical interconnect 2576 can include a rectangular shape.

The integrated circuit packaging system 2500 can include an external connector 2584, which is an electrically conductive connector, connected or attached to the outer contact pad 2514. The external connector 2584 can be attached to the outer pad bottom side 2516 or a bottom extent of the outer pad base segment 2526.

It has been discovered that the outer contact pad 2514 provide more contact areas for connectivity to an external system with the outer pad base segment 2526 directly on the encapsulation protrusion 2564 and below the outer pad overhang segment 2530.

It has also been discovered that the device connector 2554 attached to the outer pad base segment 2526 improves joint reliability with the encapsulation 2558 covering the device connector 2554 within the outer pad recess 2520 bounded by the outer pad base segment 2526.

Figure 26:
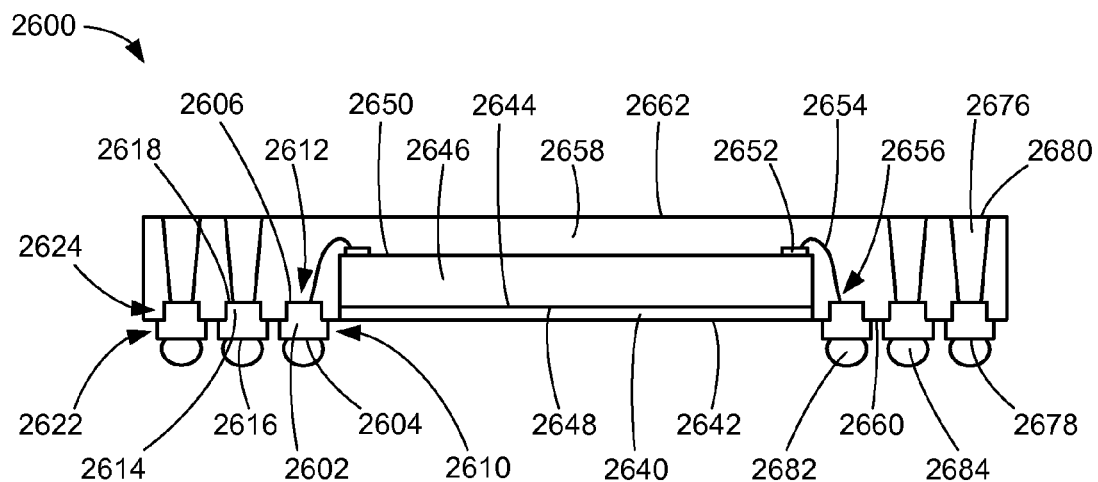
FIG. 26 is a cross-sectional view of an integrated circuit packaging system in a ninth embodiment of the present invention.

Referring now to FIG. 26, therein is shown a cross-sectional view of an integrated circuit packaging system 2600 in a ninth embodiment of the present invention. The integrated circuit packaging system 2600 can be similar to the integrated circuit packaging system 100 of FIG. 1, except for the formation of the inner contact pad 102 of FIG. 1, the outer contact pad 114 of FIG. 1, the attach layer 140 of FIG. 1, the encapsulation 158 of FIG. 1, and the vertical interconnect 176 of FIG. 1.

The integrated circuit packaging system 2600 can include an inner contact pad 2602, which is a pad closest to a semiconductor device and formed with an electrically conductive material to which an electrical connector is attached. The inner contact pad 2602 can include an inner pad bottom side 2604 and an inner pad top side 2606 at an opposite side to the inner pad bottom side 2604.

The inner contact pad 2602 can include an inner pad lower end 2610 and an inner pad upper end 2612 opposite or above the inner pad lower end 2610. The inner pad bottom side 2604 and the inner pad top side 2606 can include a bottom extent of the inner pad lower end 2610 and a top extent of the inner pad upper end 2612, respectively.

The inner pad lower end 2610 can be wider than the inner pad upper end 2612. In other words, a width of the inner pad lower end 2610 can be greater than a width of the inner pad upper end 2612. Widths of the inner pad lower end 2610 and the inner pad upper end 2612 are horizontal distances between horizontal extents of the inner pad lower end 2610 and the inner pad upper end 2612, respectively.

The integrated circuit packaging system 2600 can include an outer contact pad 2614, which is a pad further from a semiconductor device than the inner contact pad 2602 and formed with an electrically conductive material to which an electrical connector is attached. The outer contact pad 2614 can include an outer pad bottom side 2616 and an outer pad top side 2618 at an opposite side to the outer pad bottom side 2616. The outer contact pad 2614 can be adjacent or next to the inner contact pad 2602.

The outer contact pad 2614 can include an outer pad lower end 2622 and an outer pad upper end 2624 opposite or above the outer pad lower end 2622. The outer pad bottom side 2616 and the outer pad top side 2618 can include a bottom extent of the outer pad lower end 2622 and a top extent of the outer pad upper end 2624, respectively.

The outer pad lower end 2622 can be wider than the outer pad upper end 2624. In other words, a width of the outer pad lower end 2622 can be greater than a width of the outer pad upper end 2624. Widths of the outer pad lower end 2622 and the outer pad upper end 2624 are horizontal distances between horizontal extents of the outer pad lower end 2622 and the outer pad upper end 2624, respectively.

The outer pad bottom side 2616 can be coplanar with the inner pad bottom side 2604. The outer pad top side 2618 can be coplanar with the inner pad top side 2606.

The integrated circuit packaging system 2600 can include an attach layer 2640, which is a layer of a material that is used to support and mount a semiconductor device. For example, the attach layer 2640 can include a die attach material.

The attach layer 2640 can include an attach bottom side 2642 and an attach top side 2644 at an opposite side to the attach bottom side 2642. The attach bottom side 2642 can be above the inner pad bottom side 2604, the outer pad bottom side 2616, or a combination thereof.

The integrated circuit packaging system 2600 can include an integrated circuit 2646 having an inactive side 2648, an active side 2650, and a terminal 2652. The integrated circuit 2646 can be formed in a manner similar to the integrated circuit 146 of FIG. 1.

The integrated circuit 2646 and the attach layer 2640 can be above the inner contact pad 2602 and the outer contact pad 2614. The integrated circuit 2646 and the attach layer 2640 can be surrounded by a number of the inner contact pad 2602 and the outer contact pad 2614.

The inner contact pad 2602 can be between the outer contact pad 2614 and the integrated circuit 2646 or between the outer contact pad 2614 and the attach layer 2640. The inner contact pad 2602 can be closer to the integrated circuit 2646 and the attach layer 2640 than the outer contact pad 2614.

The integrated circuit packaging system 2600 can include a device connector 2654 having a connector lower end 2656. The device connector 2654 can be formed in a manner similar to the device connector 154 of FIG. 1. The connector lower end 2656 can be connected or attached to the inner pad top side 2606 or a top extent of the inner pad upper end 2612.

The integrated circuit packaging system 2600 can include an encapsulation 2658, which is a cover for a semiconductor package to seal a semiconductor device providing mechanical and environmental protection. The encapsulation 2658 can be molded over the inner contact pad 2602, the outer contact pad 2614, the attach layer 2640, the integrated circuit 2646, and the device connector 2654.

The encapsulation 2658 can be formed covering the inner pad upper end 2612, the outer pad upper end 2624, the attach layer 2640, the integrated circuit 2646, and the device connector 2654. The encapsulation 2658 can be formed covering portions of a top extent of the inner pad lower end 2610 and a top extent of the outer pad lower end 2622.

The encapsulation 2658 can include an encapsulation bottom side 2660 and an encapsulation top side 2662 at an opposite side to the encapsulation bottom side 2660. The encapsulation bottom side 2660 can be coplanar with the attach bottom side 2642, a top extent of the inner pad lower end 2610, a top extent of the outer pad lower end 2622, or a combination thereof. The encapsulation bottom side 2660 can be below the inner pad top side 2606 and the outer pad top side 2618.

The inner pad lower end 2610 and the outer pad lower end 2622 can be exposed from the encapsulation 2658. The inner pad bottom side 2604 and the outer pad bottom side 2616 can be below the encapsulation bottom side 2660.

The integrated circuit packaging system 2600 can include a vertical interconnect 2676, which is an electrically conductive connector. The vertical interconnect 2676 can be formed through the encapsulation 2658. The vertical interconnect 2676 can be formed vertically between the outer pad top side 2618 and the encapsulation top side 2662 or between a top extent of the outer pad upper end 2624 and the encapsulation top side 2662.

The vertical interconnect 2676 can include an interconnect bottom side 2678 and an interconnect top side 2680 at an opposite side to the interconnect bottom side 2678. The interconnect top side 2680 can be coplanar with the encapsulation top side 2662. The interconnect bottom side 2678 can be directly on the outer pad top side 2618 or a top extent of the outer pad upper end 2624.

The vertical interconnect 2676 can be partially exposed from the encapsulation 2658. The interconnect top side 2680 can be exposed from the encapsulation 2658.

A width of the interconnect bottom side 2678 can be less than a width of the interconnect top side 2680, a width of the outer pad top side 2618, or a combination thereof. Widths of the interconnect bottom side 2678, the interconnect top side 2680, and the outer pad top side 2618 are horizontal distances between horizontal extents of the interconnect bottom side 2678, the interconnect top side 2680, and the outer pad top side 2618, respectively.

For illustrative purposes, the vertical interconnect 2676 is shown having a conical shape, although it is understood that the vertical interconnect 2676 can include any other shape. For example, the vertical interconnect 2676 can include a rectangular shape.

The integrated circuit packaging system 2600 can include an inner external connector 2682 and an outer external connector 2684. The inner external connector 2682 and the outer external connector 2684 can be formed in a manner similar to the inner external connector 182 of FIG. 1 and the outer external connector 184 of FIG. 1, respectively.

It has been discovered that the inner contact pad 2602 and the outer contact pad 2614 provide more contact areas for connectivity to an external system with the inner pad lower end 2610 and the outer pad lower end 2622 exposed from the encapsulation 2658 and protruding the encapsulation bottom side 2660.

Figure 27:
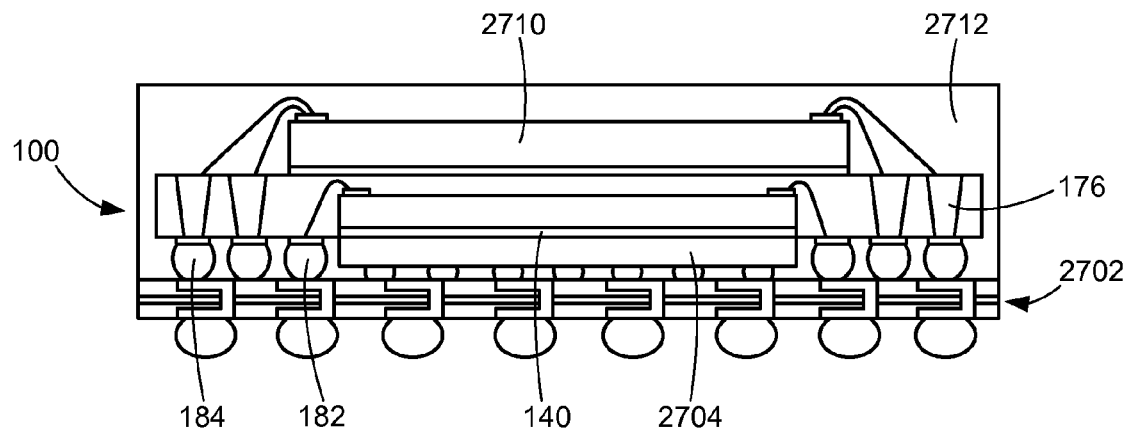
FIG. 27 is a cross-sectional view of a first application example of the present invention.

Referring now to FIG. 27, therein is shown a cross-sectional view of a first application example of the present invention. The first application example can include an application of a three-dimensional (3D) package. For example, the first application example can include a package-in-package (PIP) or 3-tier package application of a molded laser package-on-package (MLP) package with a carrier removed.

The integrated circuit packaging system 100 can be mounted over a base substrate 2702. The integrated circuit packaging system 100 can be connected to the base substrate 2702 with the inner external connector 182 and the outer external connector 184 directly on the base substrate 2702.

A base integrated circuit 2704, which is a semiconductor device including a flip chip, can be mounted over the base substrate 2702 and surrounded by the inner external connector 182 and the outer external connector 184. The base integrated circuit 2704 can be connected to the base substrate 2702 with an electrical connector. The integrated circuit packaging system 100 can be mounted over the base integrated circuit 2704 with the attach layer 140 directly on the base integrated circuit 2704.

A stack integrated circuit 2710, which is a semiconductor device including a wirebond integrated circuit or chip, can be attached over the integrated circuit packaging system 100. The stack integrated circuit 2710 can be connected to the vertical interconnect 176. The stack integrated circuit 2710, the integrated circuit packaging system 100, and the base integrated circuit 2704 can be covered with a mold cap 2712.

Figure 28:
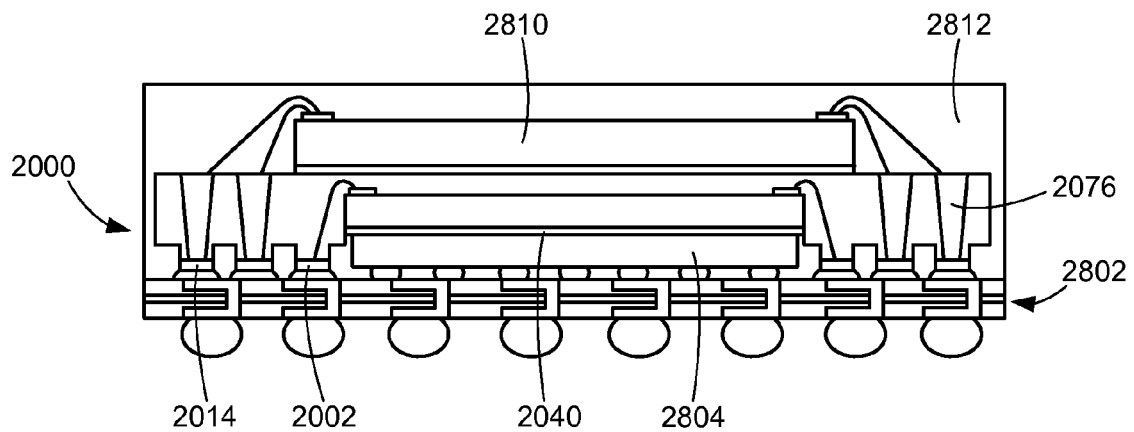
FIG. 28 is a cross-sectional view of a second application example of the present invention.

Referring now to FIG. 28, therein is shown a cross-sectional view of a second application example of the present invention. The second application example can include an application of a three-dimensional (3D) package. For example, the second application example can include a package-in-package (PIP) or 3-tier package application of a molded laser package-on-package (MLP) package with a carrier removed.

The integrated circuit packaging system 2000 can be mounted over a base substrate 2802. The inner contact pad 2002 and the outer contact pad 2014 of the integrated circuit packaging system 2000 can be connected to the base substrate 2802.

A base integrated circuit 2804, which is a semiconductor device including a flip chip, can be mounted over the base substrate 2802 and surrounded by the inner contact pad 2002 and the outer contact pad 2014. The base integrated circuit 2804 can be connected to the base substrate 2802 with an electrical connector. The integrated circuit packaging system 2000 can be mounted over the base integrated circuit 2804 with the attach layer 2040 directly on the base integrated circuit 2804.

A stack integrated circuit 2810, which is a semiconductor device including a wirebond integrated circuit or chip, can be attached over the integrated circuit packaging system 2000. The stack integrated circuit 2810 can be connected to the vertical interconnect 2076. The stack integrated circuit 2810, the integrated circuit packaging system 2000, and the base integrated circuit 2804 can be covered with a mold cap 2812.

Figure 29:
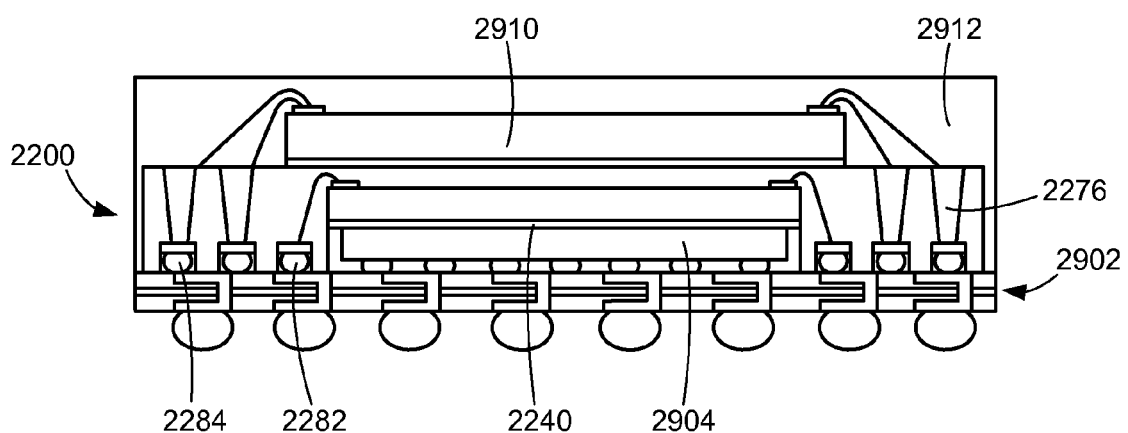
FIG. 29 is a cross-sectional view of a third application example of the present invention.

Referring now to FIG. 29, therein is shown a cross-sectional view of a third application example of the present invention. The third application example can include an application of a three-dimensional (3D) package. For example, the third application example can include a package-in-package (PIP) or 3-tier package application of a molded laser package-on-package (MLP) package with a carrier removed.

The integrated circuit packaging system 2200 can be mounted over a base substrate 2902. The integrated circuit packaging system 2200 can be connected to the base substrate 2902 with the inner external connector 2282 and the outer external connector 2284 directly on the base substrate 2902.

A base integrated circuit 2904, which is a semiconductor device including a flip chip, can be mounted over the base substrate 2902 and surrounded by the inner external connector 2282 and the outer external connector 2284. The base integrated circuit 2904 can be connected to the base substrate 2902 with an electrical connector. The integrated circuit packaging system 2200 can be mounted over the base integrated circuit 2904 with the attach layer 2240 directly on the base integrated circuit 2904.

A stack integrated circuit 2910, which is a semiconductor device including a wirebond integrated circuit or chip, can be attached over the integrated circuit packaging system 2200. The stack integrated circuit 2910 can be connected to the vertical interconnect 2276. The stack integrated circuit 2910, the integrated circuit packaging system 2200, and the base integrated circuit 2904 can be covered with a mold cap 2912.

Figure 30:
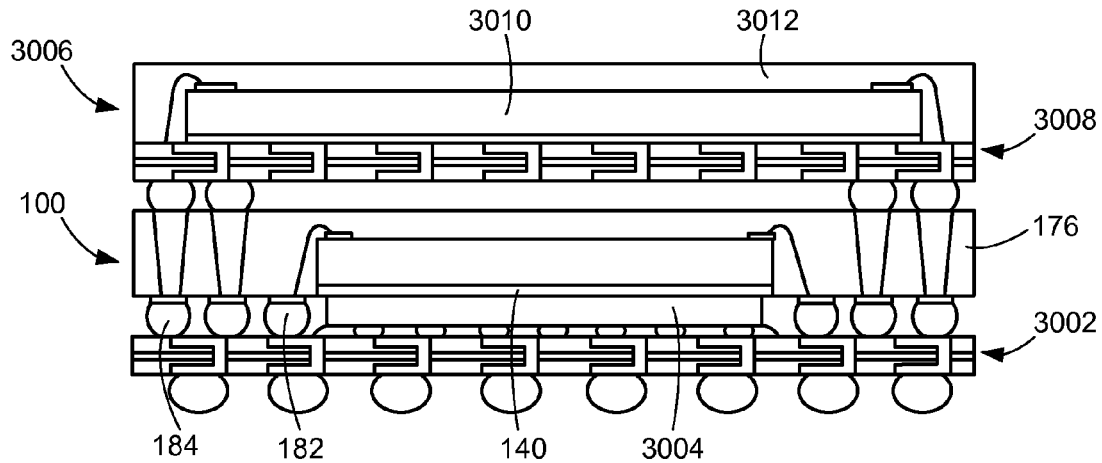
FIG. 30 is a cross-sectional view of a fourth application example of the present invention.

Referring now to FIG. 30, therein is shown a cross-sectional view of a fourth application example of the present invention. The fourth application example can include an application of a three-dimensional (3D) package. For example, the fourth application example can include a package-in-package (PIP) or 3-tier package application of a molded laser package-on-package (MLP) package with a carrier removed.

The integrated circuit packaging system 100 can be mounted over a base substrate 3002. The integrated circuit packaging system 100 can be connected to the base substrate 3002 with the inner external connector 182 and the outer external connector 184 directly on the base substrate 3002.

A base integrated circuit 3004, which is a semiconductor device including a flip chip, can be mounted over the base substrate 3002 and surrounded by the inner external connector 182 and the outer external connector 184. The base integrated circuit 3004 can be connected to the base substrate 3002 with an electrical connector protected by an underfill. The integrated circuit packaging system 100 can be mounted over the base integrated circuit 3004 with the attach layer 140 directly on the base integrated circuit 3004.

A stack package 3006 can include a stack substrate 3008, a stack integrated circuit 3010, and a mold cap 3012 over the stack substrate 3008 and the stack integrated circuit 3010. The stack integrated circuit 3010 is a semiconductor device including a wirebond integrated circuit or chip. The stack integrated circuit 3010 can be attached over and connected to the stack substrate 3008. The stack substrate 3008 can be mounted over the integrated circuit packaging system 100 and connected to the vertical interconnect 176.

Figure 31:
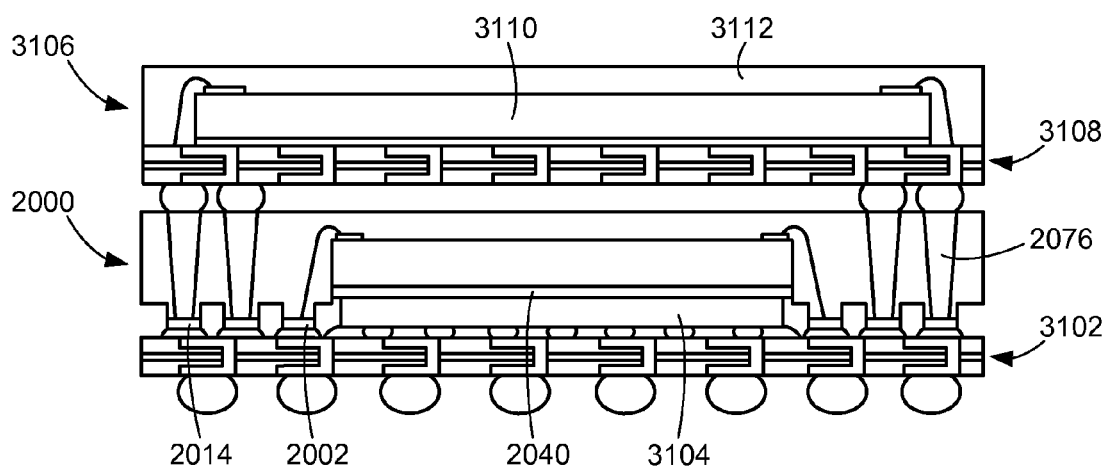
FIG. 31 is a cross-sectional view of a fifth application example of the present invention.

Referring now to FIG. 31, therein is shown a cross-sectional view of a fifth application example of the present invention. The fifth application example can include an application of a three-dimensional (3D) package. For example, the fifth application example can include a package-in-package (PIP) or 3-tier package application of a molded laser package-on-package (MLP) package with a carrier removed.

The integrated circuit packaging system 2000 can be mounted over a base substrate 3102. The inner contact pad 2002 and the outer contact pad 2014 of the integrated circuit packaging system 2000 can be connected to the base substrate 3102.

A base integrated circuit 3104, which is a semiconductor device including a flip chip, can be mounted over the base substrate 3102 and surrounded by the inner contact pad 2002 and the outer contact pad 2014. The base integrated circuit 3104 can be connected to the base substrate 3102 with an electrical connector protected by an underfill. The integrated circuit packaging system 2000 can be mounted over the base integrated circuit 3104 with the attach layer 2040 directly on the base integrated circuit 3104.

A stack package 3106 can include a stack substrate 3108, a stack integrated circuit 3110, and a mold cap 3112 over the stack substrate 3108 and the stack integrated circuit 3110. The stack integrated circuit 3110 is a semiconductor device including a wirebond integrated circuit or chip. The stack integrated circuit 3110 can be attached over and connected to the stack substrate 3108. The stack substrate 3108 can be mounted over the integrated circuit packaging system 2000 and connected to the vertical interconnect 2076.

Figure 32:
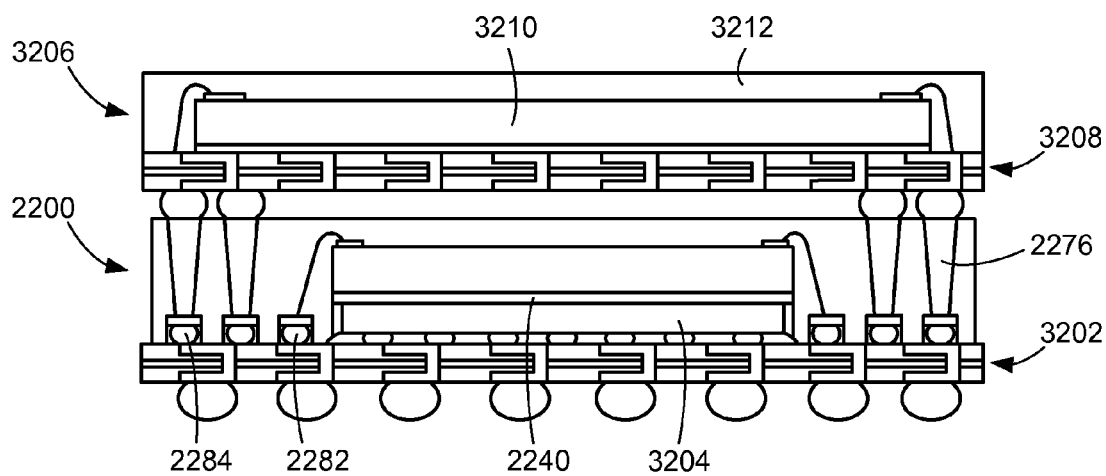
FIG. 32 is a cross-sectional view of a sixth application example of the present invention.

Referring now to FIG. 32, therein is shown a cross-sectional view of a sixth application example of the present invention. The sixth application example can include an application of a three-dimensional (3D) package. For example, the sixth application example can include a package-in-package (PIP) or 3-tier package application of a molded laser package-on-package (MLP) package with a carrier removed.

The integrated circuit packaging system 2200 can be mounted over a base substrate 3202. The integrated circuit packaging system 2200 can be connected to the base substrate 3202 with the inner external connector 2282 and the outer external connector 2284 directly on the base substrate 3202.

A base integrated circuit 3204, which is a semiconductor device including a flip chip, can be mounted over the base substrate 3202 and surrounded by the inner external connector 2282 and the outer external connector 2284. The base integrated circuit 3204 can be connected to the base substrate 3202 with an electrical connector protected by an underfill. The integrated circuit packaging system 2200 can be mounted over the base integrated circuit 3204 with the attach layer 2240 directly on the base integrated circuit 3204.

A stack package 3206 can include a stack substrate 3208, a stack integrated circuit 3210, and a mold cap 3212 over the stack substrate 3208 and the stack integrated circuit 3210. The stack integrated circuit 3210 is a semiconductor device including a wirebond integrated circuit or chip. The stack integrated circuit 3210 can be attached over and connected to the stack substrate 3208. The stack substrate 3208 can be mounted over the integrated circuit packaging system 2200 and connected to the vertical interconnect 2276.

Figure 33:
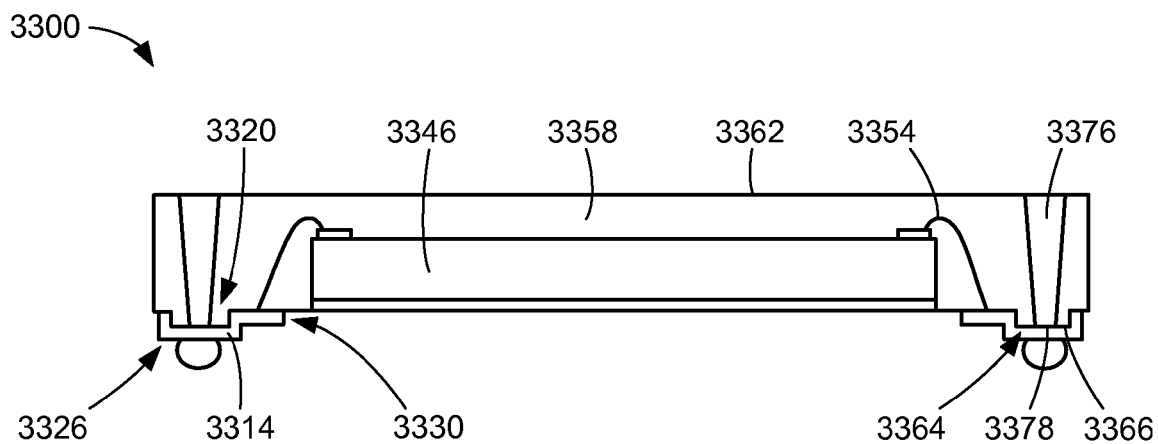
FIG. 33 is a cross-sectional view of an integrated circuit packaging system in a tenth embodiment of the present invention.

Referring now to FIG. 33, therein is shown a cross-sectional view of an integrated circuit packaging system 3300 in a tenth embodiment of the present invention. In a manner similar to the integrated circuit packaging system 2500 of FIG. 25, the integrated circuit packaging system 3300 includes an outer contact pad 3314 having an outer pad recess 3320, an outer pad base segment 3326, and an outer pad overhang segment 3330. Also in a manner similar to the integrated circuit packaging system 2500, the integrated circuit packaging system 3300 includes an integrated circuit 3346, a device connector 3354, an encapsulation 3358 having an encapsulation top side 3362 and an encapsulation protrusion 3364 having a protrusion bottom side 3366.

The outer pad overhang segment 3330 can be closer to the integrated circuit 3346 than the outer pad base segment 3326. A top extent of the outer pad overhang segment 3330 can be connected or attached to the integrated circuit 3346 with the device connector 3354.

Also in a manner similar to the integrated circuit packaging system 2500, the integrated circuit packaging system 3300 includes a vertical interconnect 3376 having an interconnect bottom side 3378. The vertical interconnect 3376 can be formed vertically through the protrusion bottom side 3366 and the encapsulation top side 3362. A lower extent of the vertical interconnect 3376 can be covered with the encapsulation 3358 within the outer pad recess 3320.

The interconnect bottom side 3378 can be coplanar with the protrusion bottom side 3366. The interconnect bottom side 3378 can be directly on a top extent of the outer pad base segment 3326.

It has been discovered that the device connector 3354 connected to the outer pad overhang segment 3330 significantly reduces wire length with the outer pad overhang segment 3330 closer to the integrated circuit 3346 than the outer pad base segment 3326.

It has also been discovered that the vertical interconnect 3376 directly on the outer pad base segment 3326 improves joint reliability with the encapsulation 3358 covering the vertical interconnect 3376 within the outer pad recess 3320 bounded by the outer pad base segment 3326.

Figure 34:
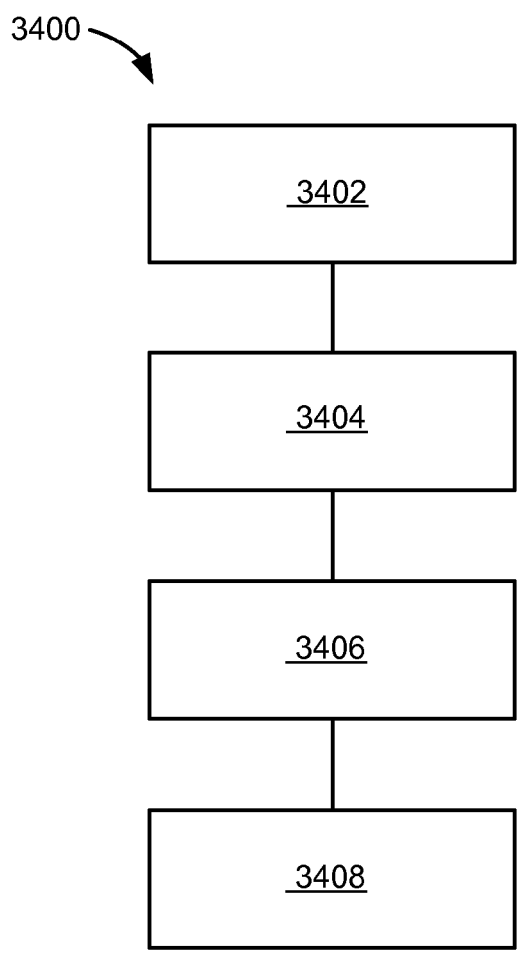
FIG. 34 is a flow chart of a method of manufacture of the integrated circuit packaging system in a further embodiment of the present invention.

Referring now to FIG. 34, therein is shown a flow chart of a method 3400 of manufacture of the integrated circuit packaging system 100 in a further embodiment of the present invention. The method 3400 includes: forming an outer contact pad having an outer pad top side in a block 3402; mounting an integrated circuit above the outer pad top side in a block 3404; forming an encapsulation having an encapsulation top side and an encapsulation bottom side, the encapsulation over the integrated circuit with the encapsulation bottom side coplanar with the outer pad top side in a block 3406; and forming a vertical interconnect through the encapsulation, the vertical interconnect having an interconnect bottom side directly on the outer pad top side and an interconnect top side exposed from the encapsulation in a block 3408.

Thus, it has been discovered that the integrated circuit packaging system of the present invention furnishes important and heretofore unknown and unavailable solutions, capabilities, and functional aspects for an integrated circuit packaging system with interconnection. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming an outer contact pad having an outer pad top side;
    mounting an integrated circuit above the outer pad top side;
    attaching a device connector to the integrated circuit;
    forming an encapsulation having an encapsulation top side and an encapsulation bottom side, the encapsulation bottom side partially exposed and the encapsulation directly on the device connector and over the integrated circuit;
    forming a vertical interconnect through the encapsulation, the vertical interconnect having an interconnect bottom side directly on the outer pad top side and an interconnect top side exposed from the encapsulation; and
    attaching an external connector on a side of the outer contact pad opposite the outer pad top side with the vertical interconnect directly thereon.

2. The method as claimed in claim 1 further comprising providing a package substrate having a substrate top side with the integrated circuit thereover, the substrate top side coplanar with the outer pad top side.

3. The method as claimed in claim 1 wherein forming the encapsulation includes forming the encapsulation having an encapsulation outer protrusion with an outer protrusion bottom side directly on the outer pad top side.

4. The method as claimed in claim 1 wherein attaching the device connector to the integrated circuit includes attaching the device connector to the outer pad top side and the integrated circuit.

5. The method as claimed in claim 1 wherein forming the encapsulation includes forming the encapsulation having an encapsulation cavity with the outer contact pad within the encapsulation cavity.

6. A method of manufacture of an integrated circuit packaging system comprising:
    forming an outer contact pad having an outer pad top side;
    mounting an integrated circuit above the outer pad top side;
    attaching a device connector to the integrated circuit;
    forming an encapsulation having an encapsulation top side and an encapsulation bottom side, the encapsulation bottom side partially exposed and the encapsulation directly on the device connector and the integrated circuit;
    forming a vertical interconnect through the encapsulation, the vertical interconnect having an interconnect bottom side directly on the outer pad top side and an interconnect top side exposed from the encapsulation and coplanar with the encapsulation top side; and
    attaching an external connector on a side of the outer contact pad opposite the outer pad top side with the vertical interconnect directly thereon.

7. The method as claimed in claim 6 wherein forming the outer contact pad includes forming the outer contact pad having an outer pad recess with the vertical interconnect within the outer pad recess.

8. The method as claimed in claim 6 wherein forming the outer contact pad includes forming the outer contact pad having an outer pad lower end protruding from the encapsulation bottom side.

9. The method as claimed in claim 6 wherein forming the outer contact pad includes forming the outer contact pad having an outer pad base segment below an outer pad overhang segment and directly on an encapsulation protrusion of the encapsulation.

10. The method as claimed in claim 6 wherein forming the outer contact pad includes forming the outer contact pad having an outer pad upper end and an outer pad lower end exposed from the encapsulation, the outer pad lower end having a width greater than a width of the outer pad upper end.

11. An integrated circuit packaging system comprising:
    an outer contact pad having an outer pad top side;
    an integrated circuit above the outer pad top side;
    a device connector attached to the integrated circuit;
    an encapsulation having an encapsulation top side and an encapsulation bottom side, the encapsulation bottom side partially exposed and the encapsulation directly on the device connector and the integrated circuit;
    a vertical interconnect through the encapsulation, the vertical interconnect having an interconnect bottom side directly on the outer pad top side and an interconnect top side exposed from the encapsulation; and
    an external connector attached on a side of the outer contact pad opposite the outer pad top side with the vertical interconnect directly thereon.

12. The system as claimed in claim 11 further comprising a package substrate having a substrate top side with the integrated circuit thereover, the substrate top side coplanar with the outer pad top side.

13. The system as claimed in claim 11 wherein the encapsulation includes an encapsulation outer protrusion with an outer protrusion bottom side directly on the outer pad top side.

14. The system as claimed in claim 11 wherein the a device connector is attached to the outer pad top side and the integrated circuit.

15. The system as claimed in claim 11 wherein the encapsulation includes an encapsulation cavity with the outer contact pad within the encapsulation cavity.

16. The system as claimed in claim 11 wherein the vertical interconnect includes the interconnect top side coplanar with the encapsulation top side.

17. The system as claimed in claim 16 wherein the outer contact pad includes an outer pad recess with the vertical interconnect within the outer pad recess.

18. The system as claimed in claim 16 wherein the outer contact pad includes an outer pad lower end protruding from the encapsulation bottom side.

19. The system as claimed in claim 16 wherein the outer contact pad includes an outer pad base segment below an outer pad overhang segment and directly on an encapsulation protrusion of the encapsulation.

20. The system as claimed in claim 16 wherein the outer contact pad includes an outer pad upper end and an outer pad lower end exposed from the encapsulation, the outer pad lower end having a width greater than a width of the outer pad upper end.

* * * * *

UNITED STATES PATENT AND TRADEMARK OFFICE
CERTIFICATE OF CORRECTION

| | | |
|---|---|---|
| PATENT NO. | : 8,502,387 B2 | Page 1 of 1 |
| APPLICATION NO. | : 12/964617 | |
| DATED | : August 6, 2013 | |
| INVENTOR(S) | : Choi et al. | |

It is certified that error appears in the above-identified patent and that said Letters Patent is hereby corrected as shown below:

In the Claims:

Column 30, claim 1, line 59, delete "and over the" and insert therefor -- and the --

Column 32, claim 14, line 26, delete "the a device" and insert therefor -- the device --

Signed and Sealed this
Twenty-seventh Day of October, 2015

Michelle K. Lee
*Director of the United States Patent and Trademark Office*